US012772789B2

(12) United States Patent
Iwasaki et al.

(10) Patent No.: US 12,772,789 B2
(45) Date of Patent: Oct. 20, 2026

(54) SUBSTRATE TREATMENT SYSTEM

(71) Applicant: SCREEN Holdings Co., Ltd., Kyoto (JP)

(72) Inventors: Akihiro Iwasaki, Kyoto (JP); Tsuyoshi Tomita, Kyoto (JP); Shinichi Taniguchi, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 159 days.

(21) Appl. No.: 18/755,641

(22) Filed: Jun. 26, 2024

(65) Prior Publication Data

US 2025/0029861 A1 Jan. 23, 2025

(30) Foreign Application Priority Data

Jun. 27, 2023 (JP) ................................ 2023-104913

(51) Int. Cl.
*H10P 72/30* (2026.01)
*H10P 72/00* (2026.01)

(52) U.S. Cl.
CPC ...... *H10P 72/3402* (2026.01); *H10P 72/0456* (2026.01); *H10P 72/3211* (2026.01); *H10P 72/3218* (2026.01); *H10P 72/3404* (2026.01); *H10P 72/3412* (2026.01); *H10P 72/0404* (2026.01); *H10P 72/0408* (2026.01)

(58) Field of Classification Search
CPC ............. H10P 72/3402; H10P 72/3404; H10P 72/3412; H10P 72/3218; H10P 72/3302; H10P 72/3211; H10P 72/3304; H10P 72/0452; H10P 72/0456; B65G 2201/0297
See application file for complete search history.

(56) References Cited

U.S. PATENT DOCUMENTS

| | | | | |
|---|---|---|---|---|
| 12,183,613 | B2 * | 12/2024 | Kanagawa | H10P 72/3312 |
| 12,384,049 | B2 * | 8/2025 | Youn | B25J 11/0095 |
| 2020/0206788 | A1 | 7/2020 | Kuwahara et al. | |
| 2021/0111038 | A1 | 4/2021 | Kanagawa et al. | |
| 2022/0172966 | A1 | 6/2022 | Choi et al. | |

(Continued)

FOREIGN PATENT DOCUMENTS

| | | | |
|---|---|---|---|
| JP | 2010-206041 | A | 9/2010 |
| JP | 2020-109786 | A | 7/2020 |

(Continued)

*Primary Examiner* — Ernesto A Suarez
*Assistant Examiner* — Adarsh Neupane
(74) *Attorney, Agent, or Firm* — OSTROLENK FABER LLP

(57) ABSTRACT

In a substrate treatment system, a stocker device, a single-wafer treatment device, an interface device, and a batch treatment device are disposed in a line and linearly in this order. A first transport robot of the stocker device transports a carrier placed on a load port to a stocker device side position. A carrier transport mechanism transports the carrier from the stocker device side position to an interface device side position. A second transport robot of the interface device transports the carrier from the interface device side position to a shelf. The batch treatment device takes out a plurality of substrates from the carrier transported to the shelf, and performs predetermined batch treatment on the plurality of taken-out substrates. The single-wafer treatment device performs treatment on a plurality of substrates one by one.

8 Claims, 14 Drawing Sheets

(56) References Cited

U.S. PATENT DOCUMENTS

| | | | | |
|---|---|---|---|---|
| 2023/0110780 | A1 | 4/2023 | Choi et al. | |
| 2023/0307279 | A1* | 9/2023 | Takebayashi ....... | H10P 72/3216 |
| 2025/0014930 | A1* | 1/2025 | Kamakura .............. | H10P 72/34 |

FOREIGN PATENT DOCUMENTS

| | | | |
|---|---|---|---|
| JP | 2021-064652 | A | 4/2021 |
| JP | 2022-057798 | A | 4/2022 |
| JP | 2022-057884 | A | 4/2022 |
| KR | 10-2022-0076279 | A | 6/2022 |
| KR | 10-2023-0051779 | A | 4/2023 |

* cited by examiner

SUBSTRATE TREATMENT SYSTEM

CROSS-REFERENCE TO RELATED APPLICATIONS

This application claims priority to Japanese Patent Application No. 2023-104913 filed Jun. 27, 2023, the subject matter of which is incorporated herein by reference in entirety.

BACKGROUND

Technical Field

The present invention relates to a substrate treatment system that performs treatment on a substrate. Examples of substrates include a semiconductor substrate, a substrate for a flat panel display (FPD), a glass substrate for a photomask, a substrate for an optical disc, a substrate for a magnetic disk, a ceramic substrate, and a substrate for a solar cell. Examples of FPDs include a liquid crystal display and an organic electroluminescence (EL) display device.

In a conventional substrate treatment system, a loading/unloading device, a single-wafer treatment device, an interface device, and a batch treatment device are disposed in this order (see, for example, JP 2021-064652 A).

The loading/unloading device includes a placement table on which a cassette is placed, a first transport device, and a first transition device that temporarily stores a substrate. The single-wafer treatment device includes a second transport device and a second transition device that temporarily stores a substrate. The interface device includes a transport robot and a lot forming unit.

The first transport device takes out five substrates in a cassette, and transports the five substrates to the first transition device. Note that the five substrates are horizontally held inside the cassette. Thereafter, the second transport device receives the five substrates from the first transition device, and transports the five substrates to the second transition device. Thereafter, the transport robot receives the five substrates from the second transition device, and transports the five substrates to the lot forming unit. In the lot forming unit, the five substrates are held vertically.

Further, in a substrate treatment system in JP 2022-057884 A, a loading device, a batch treatment device, an interface device, a single-wafer treatment device, and an unloading device are disposed in this order. A carrier transport area is disposed on these devices. A carrier transport mechanism is disposed in the carrier transport area. The carrier transport mechanism transports a carrier between the loading device and the unloading device.

Further, in a substrate treatment device in JP 2020-109786 A, a first indexer block, a first treatment block, a second indexer block, and a second treatment block are disposed in this order. A carrier transport mechanism transports a carrier between a placement table of the first indexer block and a placement table of the second indexer block.

SUMMARY

However, the following problems may occur. For example, in the substrate treatment system in JP 2021-064652 A, in order to collectively perform treatment on a plurality of substrates by using a treatment tank of the batch treatment device, the transport robot of the interface device arranges the plurality of substrates in a vertical posture in the lot forming unit. Therefore, a substrate needs to be transported from the loading/unloading device to the interface device through the single-wafer treatment device. Here, there is a possibility of the throughput of the substrate treatment system decreasing when the substrate is caused to pass through the single-wafer treatment device.

The present invention has been made in view of such circumstances, and an object thereof is to provide a substrate treatment system that prevents a decrease in throughput.

In order to achieve such an object, the present invention has the following configuration. That is, according to the present invention, there is provided a substrate treatment system that performs treatment on a substrate including a stocker device including a load port for loading and unloading a carrier storing a plurality of substrates, a first carrier placement shelf on which the carrier is placed, and a first transport robot that transports the carrier; a batch treatment device that collectively performs treatment on the plurality of substrates; a single-wafer treatment device that performs treatment on the plurality of substrates one by one; an interface device including a second carrier placement shelf on which the carrier is placed and a second transport robot that transports the carrier; and a carrier transport mechanism that transports the carrier between a stocker device side position on the stocker device side and an interface device side position on the interface device side, in which the stocker device, the single-wafer treatment device, the interface device, and the batch treatment device are disposed in a line and linearly in this order, the first transport robot transports the carrier, in which a substrate before treatment is stored, placed on the load port to the stocker device side position, the carrier transport mechanism transports the carrier in which the substrate before treatment is stored from the stocker device side position to the interface device side position, the second transport robot transports the carrier in which the substrate before treatment is stored from the interface device side position to the second carrier placement shelf, the batch treatment device takes out the plurality of the substrates from the carrier, in which the substrate before treatment is stored, transported to the second carrier placement shelf, and performs predetermined batch treatment on the plurality of taken-out substrates, the batch treatment device transports the plurality of substrates subjected to the batch treatment to the interface device, the second transport robot transports the carrier that has been emptied by taking out the plurality of substrates from the second carrier placement shelf to the interface device side position, the carrier transport mechanism transports the empty carrier from the interface device side position to the stocker device side position, the first transport robot transports the empty carrier from the stocker device side position to the first carrier placement shelf, the single-wafer treatment device performs predetermined single-wafer treatment on the plurality of substrates received from the interface device one by one, and transports the plurality of substrates subjected to the single-wafer treatment to the empty carrier transported to the first carrier placement shelf, and the first transport robot transports the carrier in which the plurality of substrates subjected to the single-wafer treatment are stored from the first carrier placement shelf to the load port.

In the substrate treatment system according to the present invention, the stocker device, the single-wafer treatment device, the interface device, and the batch treatment device are disposed in a line and linearly in this order. In such a configuration, the carrier transport mechanism transports the carrier between the stocker device side position on the stocker device side and the interface device side position on the interface device side. Therefore, the substrate can be transported from the stocker device to the interface device in units of carriers. Therefore, it is possible to prevent a decrease in throughput due to the substrate passing through the single-wafer treatment device. In addition, since the substrate is stored in the carrier, it is possible to prevent particles from adhering to the substrate when the substrate is transported from the stocker device to the interface device.

In addition, in the substrate treatment system, preferably, the batch treatment device includes a first posture turning unit that turns the plurality of substrates from a horizontal posture to a vertical posture, the interface device includes a second posture turning unit that turns the plurality of substrates subjected to the batch treatment from a vertical posture to a horizontal posture, and the batch treatment device takes out the plurality of substrates from the carrier transported to the second carrier placement shelf, turns the plurality of taken-out substrates from a horizontal posture to a vertical posture by using the first posture turning unit, and performs predetermined batch treatment on the plurality of substrates turned into the vertical posture.

As a result, the batch treatment device can perform predetermined batch treatment on the plurality of substrates turned into the vertical posture. In addition, the single-wafer treatment device can perform predetermined single-wafer treatment on a plurality of substrates turned into the horizontal posture by the interface device one by one.

Further, in the substrate treatment system, preferably, the batch treatment device includes a transfer block that is adjacent to the second carrier placement shelf, a treatment block that is adjacent to the transfer block in a first direction from the stocker device toward the interface device, and a batch substrate transport region of which one end extends to the inside of the interface device and the other end extends in the first direction, the transfer block includes a substrate handling mechanism that takes out the plurality of substrates from the carrier placed on the second carrier placement shelf and transports the plurality of taken-out substrates, and a vertical holder that is provided between the substrate handling mechanism and the batch substrate transport region, and holds the plurality of substrates received from the substrate handling mechanism in a vertical posture, the treatment block includes a batch treatment tank that stores a treatment liquid for immersing the plurality of substrates, the interface device includes a posture turning mechanism that turns the plurality of substrates subjected to the batch treatment in the batch treatment tank from a vertical posture to a horizontal posture, and the batch treatment transport region includes a batch transport mechanism that transports the plurality of substrates in the vertical posture in parallel to the first direction between the batch treatment tank, the vertical holder, and the posture turning mechanism.

The batch treatment device includes a transfer block adjacent to the second carrier placement shelf and a treatment block adjacent to the transfer block. Such a disposition is similar to that of a general batch-type substrate treatment device. In addition, in a general batch-type substrate treatment device, posture turning is generally performed in a transfer block including a substrate handling mechanism. According to the present invention, one end of the batch substrate transport region extends into the interface device, and the other end of the batch substrate transport region extends in the first direction. Further, the batch transport mechanism of the batch substrate transport region transports the plurality of substrates in the vertical posture from the batch treatment tank (treatment block) to the posture turning mechanism (interface device) while exceeding the vertical holder (transfer block). Therefore, a plurality of substrates can be efficiently transported.

Further, in the substrate treatment system, preferably, the interface device includes a carrier movement region and a posture turning region disposed in a second direction that is a horizontal direction orthogonal to the first direction, the second transport robot is provided in the carrier movement region, the posture turning mechanism is provided in the posture turning region, and the posture turning region includes a housing that blocks an atmosphere from the carrier movement region and accommodates the posture turning mechanism. As a result, the interface device includes two regions having different atmospheres. The posture turning region can ensure cleanliness more than the carrier movement region.

Further, in the substrate treatment system, preferably, the single-wafer treatment device includes a carrier transport region including the carrier transport mechanism, a single-wafer transport region including a horizontal substrate transport mechanism that transports at least one substrate in a horizontal posture, and a single-wafer treatment region including a single-wafer treatment chamber that performs predetermined treatment on one substrate, the carrier transport region, the single-wafer transport region, and the single-wafer treatment region are each provided to extend in a first direction from the stocker device toward the interface device, and the carrier transport region, the single-wafer transport region, and the single-wafer treatment region are disposed side by side in this order in a second direction that is a horizontal direction orthogonal to the first direction, and the horizontal substrate transport mechanism transports the at least one substrate between the interface device, the single-wafer treatment chamber, and the carrier transported to the first carrier placement shelf.

In the assembly of the substrate treatment system, when the carrier transport mechanism is disposed above the single-wafer treatment device, it is necessary to transport the carrier transport mechanism to above the single-wafer treatment device. According to the present invention, the carrier transport region including the carrier transport mechanism is disposed on the side of the single-wafer transport region and the single-wafer treatment region. Therefore, it is possible to reduce the burden of carrying the carrier transport mechanism, and thus, it is possible to relatively easily assemble the substrate treatment system.

In addition, neither of the first transport robot and the second transport robot needs to transport the carrier to a position higher than a ceiling wall of the single-wafer treatment device. Therefore, the carrier can be efficiently transported between the stocker device and the interface device. In addition, since the carrier transport region, the single-wafer transport region, and the single-wafer treatment region are disposed side by side in the horizontal direction, it is possible to curb an increase in a length of the substrate treatment system in the width direction.

In the substrate treatment system, the carrier transport mechanism is preferably provided above the single-wafer treatment device to overlap the single-wafer treatment device in a plan view.

As a result, the single-wafer treatment device can increase a region in which single-wafer treatment is performed. That is, the single-wafer treatment device can include more single-wafer treatment chambers. Therefore, the throughput can be improved.

Preferably, the substrate treatment system further includes a second carrier transport mechanism that transports the carrier between a second stocker device side position on the stocker device side and a second interface device side position on the interface device side.

Since the number of carrier transport mechanisms increases, it is possible to efficiently transport the carrier between the stocker device and the interface device.

In the substrate treatment system described above, preferably, the first transport robot includes a movable first grip portion that grips the carrier or a movable first support portion that supports a lower surface of the carrier, the second transport robot includes a movable second grip portion that grips the carrier or a movable second support portion that supports a lower surface of the carrier, and the carrier transport mechanism includes a movable third grip portion that grips the carrier or a movable placement table on which the carrier is placed.

According to the substrate treatment system of the present invention, it is possible to prevent a decrease in throughput.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

DETAILED DESCRIPTION

First Embodiment

Figure 1:
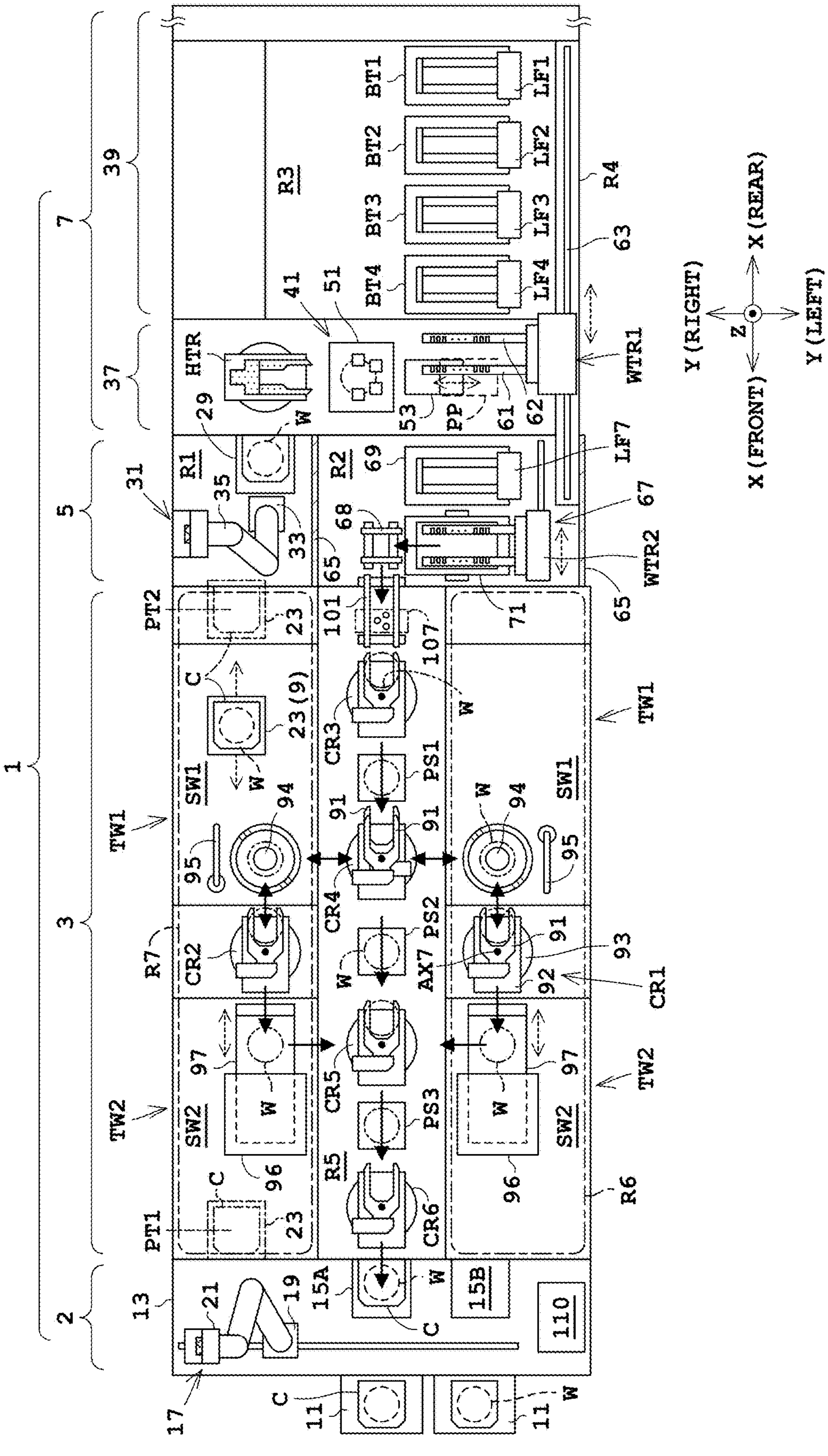
FIG. 1 is a plan view of a substrate treatment system according to a first embodiment.
Figure 2:
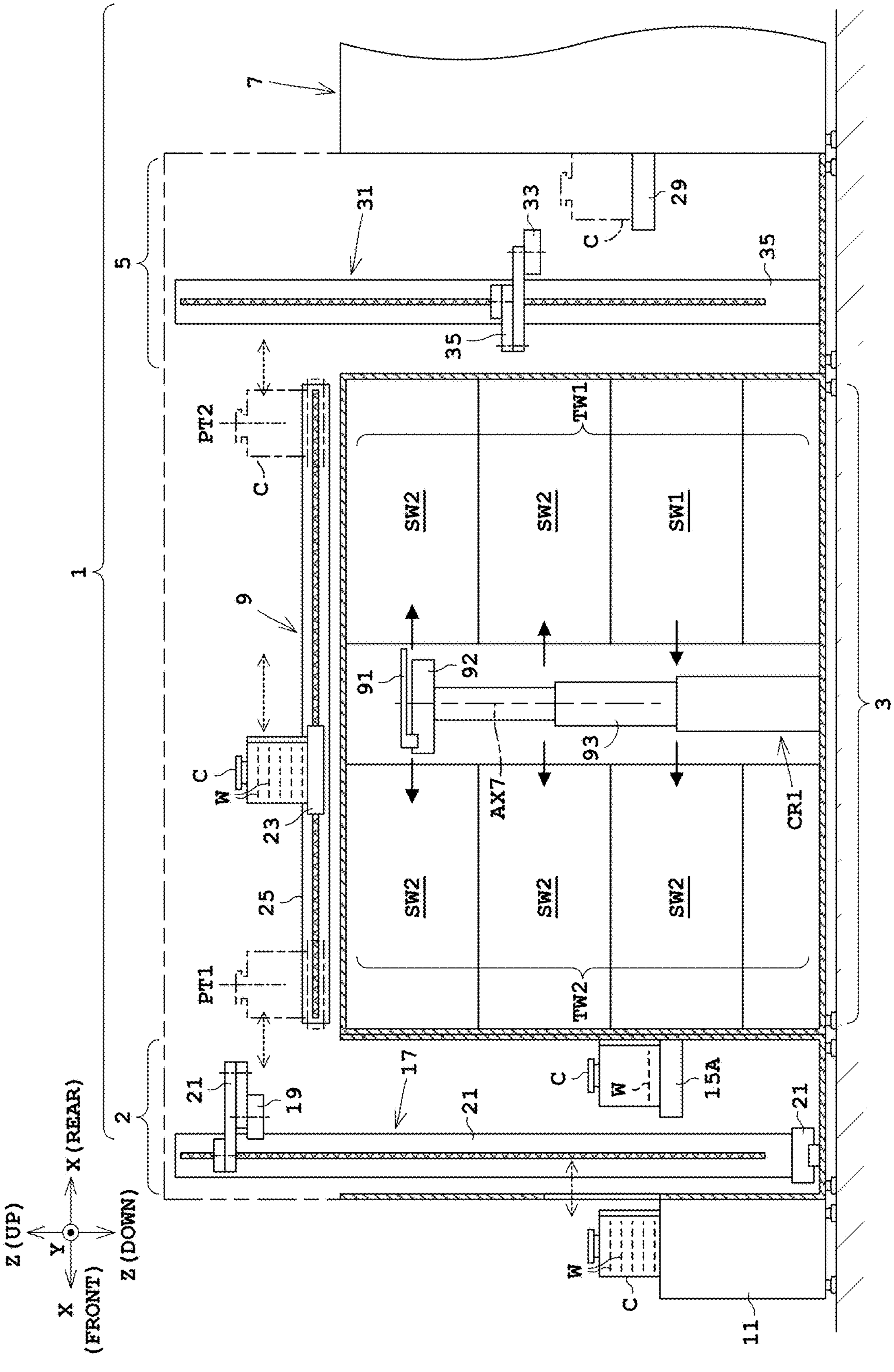
FIG. 2 is a left side view of the substrate treatment system according to the first embodiment.

Hereinafter, a first embodiment of the present invention will be described with reference to the drawings. FIG. 1 is a plan view of a substrate treatment system 1 according to a first embodiment. FIG. 2 is a left side view of the substrate treatment system 1 according to the first embodiment.

<1. Overall Configuration>

The substrate treatment system 1 includes a stocker device 2, a single-wafer treatment device 3, an interface device 5, a batch treatment device 7, and a carrier transport mechanism 9. The stocker device 2, the single-wafer treatment device 3, the interface device 5, and the batch treatment device 7 are disposed in a line and linearly in this order.

FIG. 1 will be referred to. A substrate treatment system 1 performs treatment on a substrate W. The substrate treatment system 1 performs, for example, chemical liquid treatment, washing treatment, drying treatment, and the like on the substrate W. The substrate treatment system 1 adopts a treatment method (so-called hybrid method) having both a batch type and a single-wafer type. The batch type is a method of collectively performing treatment on a plurality of substrates W in a vertical posture. The single-wafer type is a method of performing treatment on the substrates W one by one in a horizontal posture.

In the present specification, for convenience, a direction in which the stocker device 2, the single-wafer treatment device 3, the interface device 5, and the batch treatment device 7 are arranged will be referred to as a "front-rear direction X". The front-rear direction X is horizontal. In the front-rear direction X, for example, a direction from the batch treatment device 7 toward the stocker device 2 will be referred to as a "front side". A direction opposite to the front will be referred to as a "rear side". A horizontal direction orthogonal to the front-rear direction X will be referred to as a "width direction Y". One direction in the "width direction Y" will be referred to as a "right side" as appropriate. A direction opposite to the right side will be referred to as a "left side". A direction perpendicular to the horizontal direction will be referred to as a "vertical direction Z". In each drawing, front, rear, right, left, up, and down are illustrated for reference as appropriate.

<2. Stocker Device>

The stocker device 2 accommodates at least one carrier C. The carrier C stores a plurality of (for example, twenty-five) substrates W in a horizontal posture aligned in the vertical direction Z at predetermined intervals (for example, 10 mm). As the carrier C, for example, a front opening unify pod (FOUP) is used, but the carrier C is not limited thereto.

The stocker device 2 includes a plurality of (for example, two) load ports 11 and a stocker body 13. The two load ports 11 are provided adjacent to the front side of the stocker body 13. Each of the two load ports 11 is used to load and unload the carrier C. The stocker body 13 includes a plurality of shelves 15A and 15B and a first transport robot 17. The shelf 15A is a shelf for storing the substrate W in the carrier C. The shelf 15B is a storage shelf. The shelf 15A is provided adjacent to the front side of the single-wafer treatment device 3. The shelf 15A corresponds to a first carrier placement shelf of the present invention.

The first transport robot 17 transports the carrier C between the two load ports 11, the shelf 15A, the shelf 15B, and the placement table 23 moved to a predetermined position on the stocker device 2 side. The first transport robot 17 includes a grip portion (gripper) 19 and a movement portion 21. There is a protrusion on the upper surface of the carrier C. The grip portion 19 grips the protrusion of the carrier C, for example. The movement portion 21 moves the grip portion 19 in the vertical direction Z and the horizontal direction (the front-rear direction X and the width direction Y). Each of the grip portion 19 and the movement portion 21 is driven by one or more electric motors.

<3. Carrier Transport Mechanism>

FIGS. 1 and 2 will be referred to. The carrier transport mechanism 9 is provided above the single-wafer treatment device 3 to overlap a part or the whole of the single-wafer treatment device 3 in a plan view. The carrier transport mechanism 9 transports the carrier C between a stocker device side position PT1 on the stocker device 2 side and an interface device side position PT2 on the interface device 5 side. The stocker device side position PT1 is a position where the carrier C is delivered between the first transport robot 17 and the carrier transport mechanism 9. The interface device side position PT2 is a position where the carrier C is delivered between the carrier transport mechanism 9 and the second transport robot 31 (described later).

The carrier transport mechanism 9 includes a placement table 23 and a table movement portion 25. The carrier C is placed on the placement table 23. The table movement portion 25 moves the placement table 23 on which the carrier C is placed in parallel to the rear side (front-rear direction X). The table movement portion 25 is provided on, for example, a side wall 27 provided on the single-wafer treatment device 3 and extending in the front-rear direction X (see FIG. 5). The table movement portion 25 includes, for example, an electric motor, a guide rail, and a slider. The table movement portion 25 includes a screw shaft or a rack and a pinion.

<4. Interface Device (Carrier Movement Region)>

The interface device 5 is provided adjacent to the rear side of the single-wafer treatment device 3. The interface device 5 includes a carrier movement region R1 and a posture turning region R2. The carrier movement region R1 and the posture turning region R2 are disposed in the width direction Y. The carrier movement region R1 is disposed on the right side of the posture turning region R2.

The carrier movement region R1 includes a shelf 29 and a second transport robot 31. The shelf 29 is provided adjacent to the front side of the batch treatment device 7 and the transfer block 37. The carrier C is placed on the shelf 29.

The second transport robot 31 transports the carrier C between the placement table 23 moved to a predetermined position on the interface device 5 side and the shelf 29. The second transport robot 31 includes a grip portion (gripper) 33 and a movement portion 35. The grip portion 33 grips, for example, a protrusion on the upper surface of the carrier C. The movement portion 35 moves the grip portion 33 in the vertical direction Z and the horizontal direction (at least the front-rear direction X). The movement portion 35 is driven by an electric motor. Moreover, the grip portion 33 is driven by an electric motor.

<5. Batch Treatment Device>

The batch treatment device 7 collectively performs treatment on a plurality of (for example, twenty-five or fifty) substrates W. More specifically, the batch treatment device 7 takes out a plurality of (for example, twenty-five) substrates W from the carrier C transported to the shelf 29. Then, the batch treatment device 7 turns the plurality of (for example, twenty-five or fifty) taken-out substrates W from a horizontal posture to a vertical posture by using the first posture turning mechanism 41. The batch treatment device 7 performs predetermined batch treatment on a plurality of (for example, twenty-five or fifty) substrates W turned into the vertical posture. The batch treatment device 7 transports the plurality of substrates W subjected to the batch treatment to the interface device 5.

As illustrated in FIG. 1, the batch treatment device 7 includes a transfer block 37 and a treatment block 39. The transfer block 37 is provided adjacent to the rear side of the interface device 5. The transfer block 37 is provided adjacent to the rear side of the shelf 29. The treatment block 39 is adjacent to the transfer block 37 on the rear side. In other words, the treatment block 39 is provided adjacent to the rear side of the transfer block 37.

<5-1. Transfer Block>

The transfer block 37 includes a substrate handling mechanism (robot) HTR and a first posture turning mechanism 41. The substrate handling mechanism HTR is provided on the rear side of the shelf 29. The substrate handling mechanism HTR collectively takes out a plurality of (for example, twenty-five) substrates W from the carrier C placed on the shelf 29, and transports the taken-out substrates W to the first posture turning mechanism 41 in a horizontal posture.

Figure 3A:
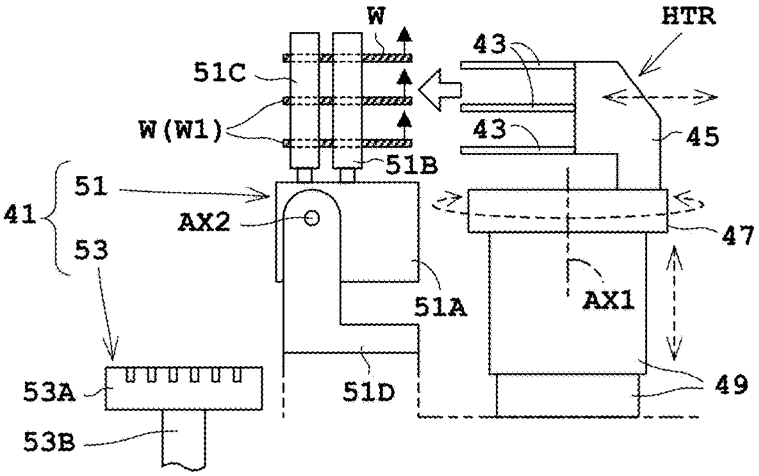
FIGS. 3A to 3C are side views for describing a substrate handling mechanism and a first posture turning mechanism.
Figure 3B:
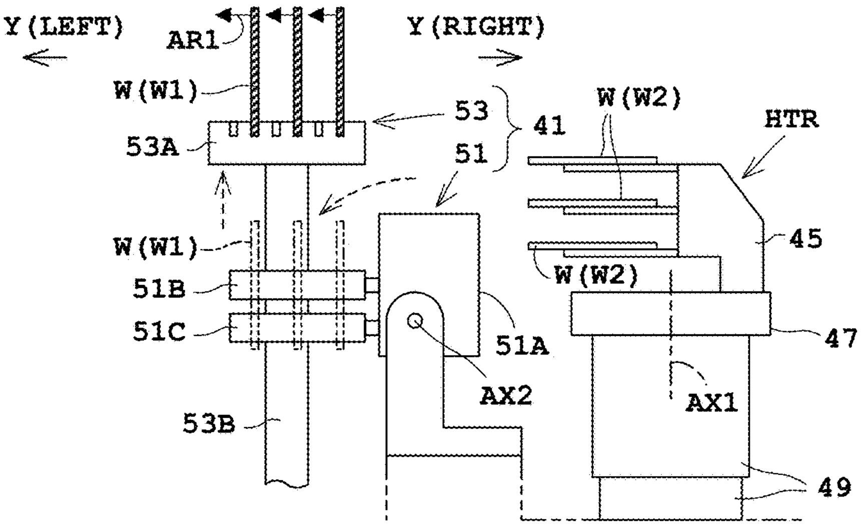
Figure 3C:
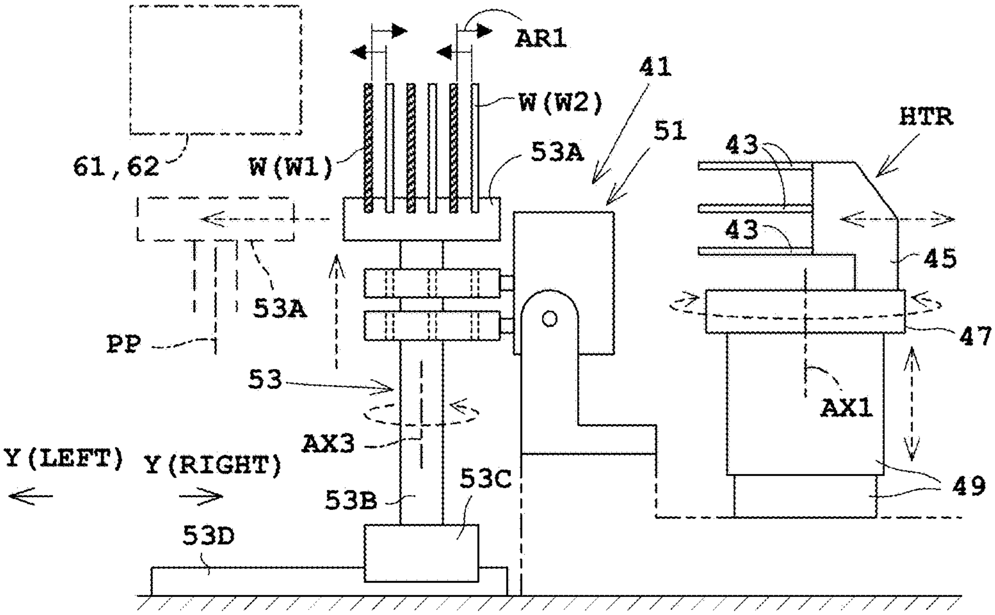

Each of FIGS. 3A to 3C is a side view for describing the substrate handling mechanism HTR and the first posture turning mechanism 41. The substrate handling mechanism HTR includes a plurality of (for example, twenty-five) hands 43. Each hand 43 holds one substrate W.

In FIGS. 3A to 3C, for convenience of illustration, it is assumed that the substrate handling mechanism HTR includes three hands 43. In addition, it is assumed that a pair of horizontal holding portions 51B and a pair of vertical holding portions 51C that will be described later hold three substrates W. Further, it is assumed that a pusher 53A that will be described later supports six substrates W.

The substrate handling mechanism HTR includes a hand support portion 45, an advance/retract portion 47, and an elevation rotation portion 49. The hand support portion 45 supports the plurality of hands 43. The advance/retract portion 47 advances and retracts the plurality of hands 43 via the hand support portion 45. The elevation rotation portion 49 lifts and lowers the plurality of hands 43 and the advance/retract portion 47. The elevation rotation portion 49 rotates the advance/retract portion 47 about a vertical axis AX1 to change an orientation of the hand 43. The elevation rotation portion 49 is fixed to the floor surface and does not move in the horizontal direction (the front-rear direction X and the width direction Y). The advance/retract portion 47 and the elevation rotation portion 49 each include an electric motor. In addition, the substrate handling mechanism HTR may include a hand (not illustrated) for transporting only one substrate W, separately from the hand 43.

The first posture turning mechanism 41 turns a plurality of (for example, twenty-five) substrates W transported by the substrate handling mechanism HTR from a horizontal posture to a vertical posture. The first posture turning mechanism 41 includes a posture turning unit 51 and a pusher mechanism 53. The substrate handling mechanism HTR, the posture turning unit 51, and the pusher mechanism 53 are disposed on the left side in this order. In addition, as illustrated in FIG. 1, the first posture turning mechanism 41 (including a pusher 53A that will be described later) is provided between the substrate handling mechanism HTR and a batch substrate transport region R4 (described later).

As illustrated in FIG. 3A, the posture turning unit 51 includes a support base 51A, a pair of horizontal holding portions 51B, a pair of vertical holding portions 51C, and a rotation driving portion 51D. The pair of horizontal holding portions 51B and the pair of vertical holding portions 51C are provided on the support base 51A. When the substrates W are in the horizontal posture, the pair of horizontal holding portions 51B supports the substrates W from below while being in contact with the lower surfaces of the respective substrates W. In addition, when the substrate W is in the vertical posture, the pair of vertical holding portions 51C holds the substrate W. The rotation driving portion 51D rotates the support base 51A about a horizontal axis AX2.

As illustrated in FIG. 3C, the pusher mechanism 53 includes a pusher 53A, an elevation rotation portion 53B, a horizontal movement portion 53C, and a rail 53D. The pusher 53A holds a lower portion of each of a plurality of (for example, twenty-five or fifty) substrates W in a vertical posture. In addition, the pusher 53A holds the plurality of substrates W received from the substrate handling mechanism HTR in the vertical posture via the posture turning unit 51. The elevation rotation portion 53B lifts and lowers the pusher 53A in the vertical direction Z. The elevation rotation portion 53B rotates the pusher 53A about a vertical axis AX3. As a result, an orientation of the device surface of the substrate W indicated by an arrow AR1 may be set to any orientation.

The horizontal movement portion 53C horizontally moves the pusher 53A and the elevation rotation portion 53B along the rail 53D. The rail 53D extends in the width direction Y. Note that each of the rotation driving portion 51D, the elevation rotation portion 53B, and the horizontal movement portion 53C includes an electric motor. Note that the posture turning unit 51 corresponds to a first posture turning unit of the present invention. The pusher 53A corresponds to a vertical holder of the present invention.

Here, an operation of the first posture turning mechanism 41 will be described. For example, each of four batch treatment tanks BT1 to BT4 that will be described later of the treatment block 39 collectively performs treatment on fifty substrates W corresponding to two carriers C. Therefore, the pusher 53A holds the fifty substrates W (W1, W2) while a posture of the fifty substrates W is turned twenty-five substrates at a time. The twenty-five substrates W1 will be referred to as a first substrate group as appropriate. The twenty-five substrates W2 will be referred to as a second substrate group as appropriate. In a case where the substrates W1 and W2 are not particularly distinguished, the substrate W1 and the substrate W2 are described as a substrate W.

FIG. 3A will be referred to. The posture turning unit 51 receives twenty-five substrates W1 from the substrate handling mechanism HTR. In this case, the twenty-five substrates W1 are in a horizontal posture and aligned at a full pitch (for example, at intervals of 10 mm). The full pitch will also be referred to as a normal pitch. The device surface of each substrate W1 faces upward. The device surface of the substrate W is a surface on which an electronic circuit is formed, and will be referred to as a "front surface". A back surface of the substrate W is a surface on which no electronic circuit is formed. A surface on an opposite side to the device surface is the back surface.

FIG. 3B will be referred to. The rotation driving portion 51D of the posture turning unit 51 rotates the pair of horizontal holding portions 51B and the like by 90 degrees about the horizontal axis AX2 to turn the twenty-five substrates W1 from the horizontal posture to the vertical posture. Thereafter, the pusher mechanism 53 lifts the pusher 53A to receive the twenty-five substrates W1 from the posture turning unit 51. Thereafter, the pusher mechanism 53 rotates the pusher 53A by 180 degrees about the vertical axis AX3. Thus, the orientation of the twenty-five substrates W1 is changed from the left side to the right side.

Thereafter, the posture turning unit 51 receives twenty-five substrates W2 from the substrate handling mechanism HTR, and turns the twenty-five substrates W2 from the horizontal posture to the vertical posture. Thereafter, the pusher mechanism 53 lifts the pusher 53A holding the twenty-five substrates W1. As a result, the pusher 53A further receives the twenty-five substrates W2.

FIG. 3C will be referred to. The pusher 53A holds the fifty substrates W (W1, W2). The fifty substrates W are aligned at a half pitch (for example, at intervals of 5 mm). Note that the half pitch is an interval half of the full pitch. Thereafter, the pusher mechanism 53 moves the pusher 53A holding the fifty substrates W to a substrate delivery position PP below a pair of chucks 61 and 62 of a batch transport mechanism WTR1 (described later) along the rail 53D.

<5-2. Treatment Block>

The treatment block 39 includes a batch treatment region R3. The batch treatment region R3 is adjacent to the rear side of the transfer block 37. The batch treatment region R3 includes, for example, four batch treatment tanks BT1 to BT4. The four batch treatment tanks BT1 to BT4 are disposed in a line in the direction (front-rear direction X) in which the batch treatment region R3 extends. Each of the four batch treatment tanks BT1 to BT4 collectively performs immersion treatment (batch treatment) on a plurality of (for example, twenty-five or fifty) substrates W. Each of the four batch treatment tanks BT1 to BT4 stores a treatment liquid (for example, a chemical liquid or pure water) for immersing the plurality of substrates W.

The four batch treatment tanks BT1 to BT4 include, for example, two chemical liquid treatment tanks BT1 and BT3 and two water washing treatment tanks BT2 and BT4. The chemical liquid treatment tank BT1 and the water washing treatment tank BT2 configure one set, and the chemical liquid treatment tank BT3 and the water washing treatment tank BT4 configure the other set. A combination of a chemical liquid treatment tank and a water washing treatment tank is not limited to this example. The number of batch treatment tanks is not limited to four, and may be one or two or more.

Each of the two chemical liquid treatment tanks BT1 and BT3 performs etching treatment by using a chemical liquid. As the chemical liquid, for example, a phosphoric acid is used. Each of the chemical liquid treatment tanks BT1 and BT3 stores a chemical liquid supplied from a chemical liquid ejection pipe (not illustrated). Each of the two water washing treatment tanks BT2 and BT4 performs pure water washing treatment of washing away the chemical liquid attached to the plurality of substrates W with pure water. For example, deionized water (DIW) is used as pure water. Each of the water washing treatment tanks BT2 and BT4 stores pure water supplied from a pure water ejection pipe (not illustrated).

Four lifters LF1 to LF4 are provided in the four batch treatment tanks BT1 to BT4, respectively. For example, the lifter LF1 holds the substrates W in a vertical posture aligned at a half pitch (for example, an interval of 5 mm) which is a predetermined interval. The lifter LF1 lifts and lowers the plurality of substrates W between a treatment position inside the batch treatment tank BT1 and a delivery position above the batch treatment tank BT1. The other three lifters LF2 to LF4 are configured similarly to the lifter LF1.

<5-3. Batch Substrate Transport Region>

The batch treatment device 7 further includes a batch substrate transport region R4. The batch substrate transport region R4 is adjacent to the left side of the batch treatment region R3. One end of the batch substrate transport region R4 extends to the inside of the interface device 5. The other end of the batch substrate transport region R4 extends to the rear side. The batch substrate transport region R4 includes a batch transport mechanism (robot) WTR1.

The batch transport mechanism WTR1 transports a plurality of substrates W between the four batch treatment tanks BT1 to BT4, the substrate delivery position PP of the first posture turning mechanism 41, and a standby tank 69 (described later) of the second posture turning mechanism 67. The four batch treatment tanks BT1 to BT4, the substrate delivery position PP, the standby tank 69 (described later), and an underwater posture turning unit 71 (described later) are aligned in a line in the front-rear direction X. Therefore, the batch transport mechanism WTR1 transports the plurality of substrates W in a vertical posture in parallel to the rear side or the front-rear direction X.

The batch transport mechanism WTR1 includes a pair of chucks 61 and 62 and a guide rail 63. Each of the chucks 61 and 62 includes, for example, fifty holding grooves for holding fifty substrates W. Each of the two chucks 61 and 62 extends parallel to the width direction Y (FIG. 1) in a plan view. The batch transport mechanism WTR1 opens and closes the two chucks 61 and 62. The batch transport mechanism WTR1 moves the pair of chucks 61 and 62 along the guide rail 63. The batch transport mechanism WTR1 is driven by an electric motor.

<6. Interface Device (Posture Turning Region)>

Figure 4:
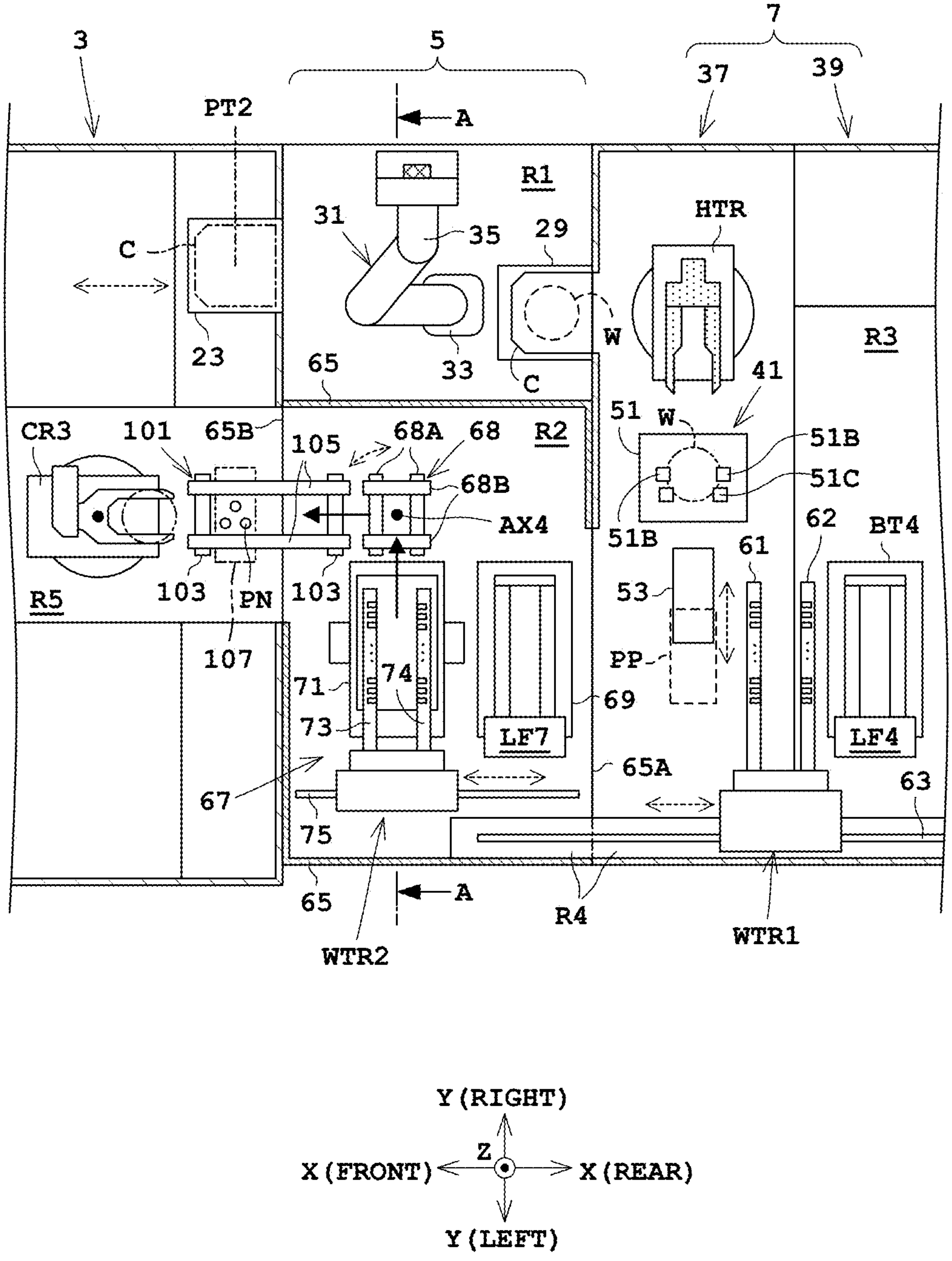
FIG. 4 is a plan view for describing an interface device.
Figure 5:
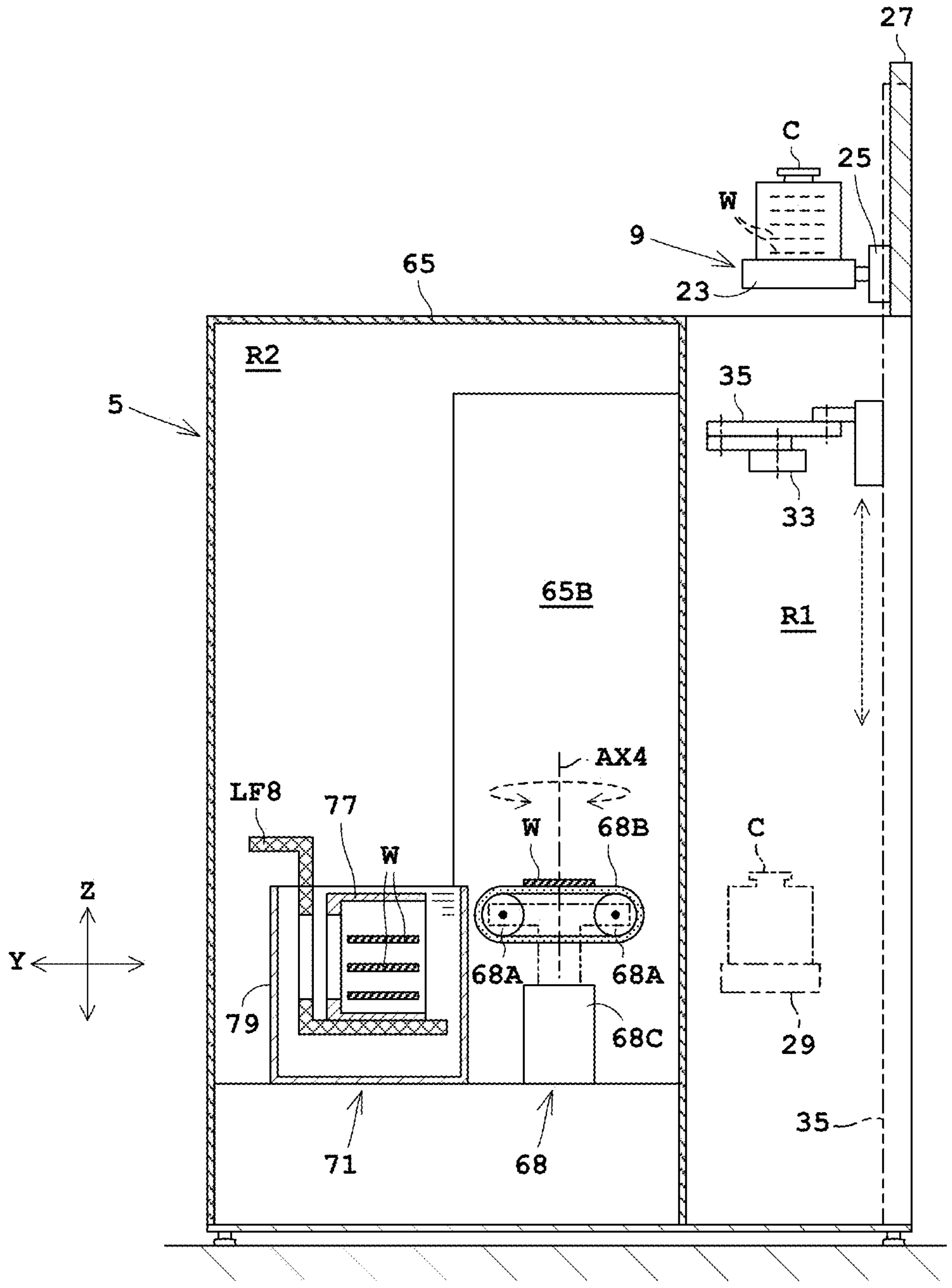
FIG. 5 is a longitudinal cross-sectional view of the interface device illustrated in FIG. 4 as viewed in a direction of an arrow A-A.

FIG. 4 is a plan view for describing the interface device 5. FIG. 5 is a longitudinal cross-sectional view of the interface device 5 illustrated in FIG. 4 as viewed in a direction of an arrow A-A. FIGS. 6A to 6C, 7A to 7C, 8A, and 8B are diagrams for describing the second posture turning mechanism 67. The posture turning region R2 includes a housing 65 that blocks atmosphere from the carrier movement region R1 and the outside of the substrate treatment system 1. As a result, the interface device 5 includes two regions (the carrier movement region R1 and the posture turning region R2) having different atmospheres. The posture turning region R2 can ensure cleanliness more than the carrier movement region R1.

The housing 65 includes two openings 65A and 65B that communicate with the transfer block 37 and a single-wafer transport region R5 (described later), respectively. The posture turning region R2 includes a second posture turning mechanism 67 and a direction turning belt conveyor 68. The housing 65 accommodates the second posture turning mechanism 67 and the direction turning belt conveyor 68. The second posture turning mechanism 67 turns a plurality of (for example, twenty-five or fifty) substrates W subjected to batch treatment in any of the four batch treatment tanks BT1 to BT4 from a vertical posture to a horizontal posture.

The direction turning belt conveyor 68 receives one substrate W and transports the substrate W to the single-wafer treatment device 3. The direction turning belt conveyor 68 includes two pulleys 68A, two belts 68B, and an elevation rotation portion 68C. The two belts 68B are stretched around the two pulleys 68A. At least one of the two pulleys 68A is rotationally driven by an electric motor. The elevation rotation portion 68C lifts and lowers the two pulleys 68A and the two belts 68B, and rotates the two pulleys 68A and the two belts 68B about a vertical axis AX4.

In order to change a transport direction of one substrate W on the two belts 68B, the elevation rotation portion 68C, for example, lifts and lowers the two pulleys 68A and the like to a height position that does not interfere with an underwater posture turning unit 71 (described later) and a belt conveyor 101 (described later), and then rotates the two pulleys 68A and the like about the vertical axis AX4.

<6-1. Configuration of Second Posture Turning Mechanism>

The second posture turning mechanism 67 includes a standby tank 69, a selective transport mechanism (robot) WTR2, and an underwater posture turning unit 71. The standby tank 69 is provided on the front side of the substrate delivery position PP. The standby tank 69 is provided with a lifter LF7. The lifter LF7 is configured similarly to the lifter LF1. The standby tank 69 stores pure water (for example, DIW) supplied from a pure water ejection pipe (not illustrated).

The selective transport mechanism WTR2 includes a pair of chucks 73 and 74 and a guide rail 75. The pair of chucks 73 and 74 is opened and closed. Each of the chucks 73 and 74 includes, for example, twenty-five holding grooves and twenty-five passage grooves alternately disposed. Therefore, the selective transport mechanism WTR2 can extract one substrate group of the twenty-five substrates W1 and the twenty-five substrates W2 from the fifty substrates W in which the twenty-five substrates W1 and the twenty-five substrates W2 are alternately disposed.

The selective transport mechanism WTR2 transports a plurality of (for example, twenty-five) selectively extracted substrates W between the standby tank 69 and the underwater posture turning unit 71. The pair of chucks 73 and 74 is moved along the guide rail 75 linearly extending in the front-rear direction X. In order to selectively extract one substrate group of the twenty-five substrates W1 and the twenty-five substrates W2, the selective transport mechanism WTR2 can move the pair of chucks 73 and 74 in the width direction Y, for example.

Figure 6A:
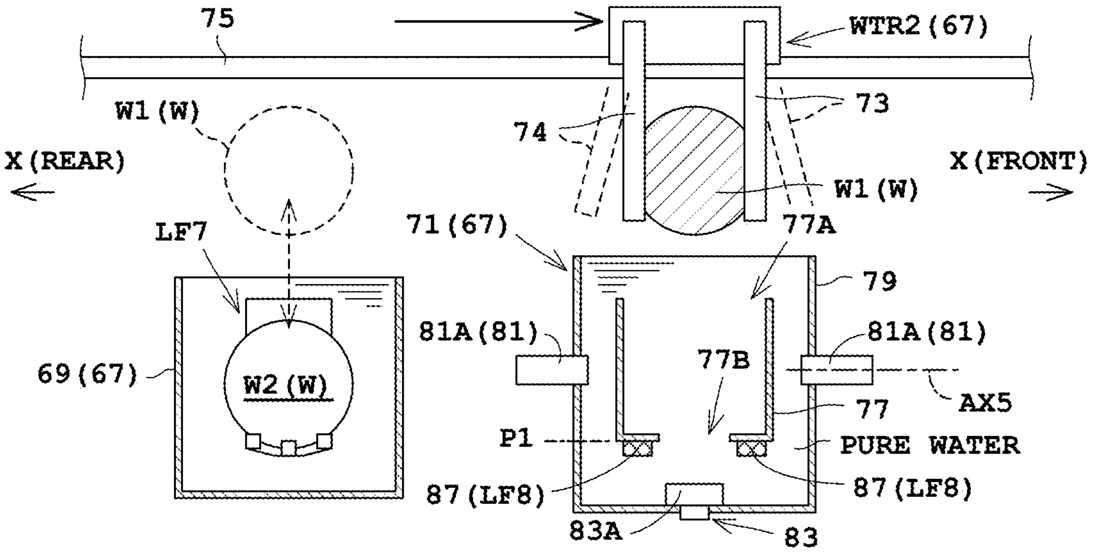
FIGS. 6A to 6C are diagrams for describing a second posture turning mechanism.

FIG. 6A will be referred to. The underwater posture turning unit 71 is provided on the front side of the standby tank 69. The underwater posture turning unit 71 includes an in-tank carrier 77, a lifter LF8, a posture turning tank 79, a rotation mechanism 81, a pusher mechanism 83, and a horizontal pushing mechanism 85 (see FIG. 8B).

The in-tank carrier 77 can store a plurality of (for example, twenty-five) substrates W. The in-tank carrier 77 includes a gateway 77A and a back opening 77B. The gateway 77A is an opening through which the substrate W passes. The back opening 77B faces the gateway 77A. The back opening 77B is formed to have a width smaller than a diameter of the stored substrate W in the radial direction of the substrate W. Thus, the plurality of substrates W cannot pass through the back opening 77B.

The lifter LF8 includes two carrier support portions 87 that support the in-tank carrier 77. The lifter LF8 lifts and lowers the two carrier support portions 87. The posture turning tank 79 accommodates the in-tank carrier 77, the two carrier support portions 87 of the lifter LF8, and a pusher 83A (described later). The posture turning tank 79 stores pure water (for example, DIW) supplied from a pure water ejection pipe (not illustrated). As a result, the in-tank carrier 77 can be immersed in the pure water in the posture turning tank 79.

The second posture turning mechanism 67 corresponds to a posture turning mechanism of the present invention. The underwater posture turning unit 71 corresponds to a second posture turning unit of the present invention. In addition, the second posture turning unit may be an articulated robot that turns the substrate W from a vertical posture to a horizontal posture instead of the underwater posture turning unit 71. The articulated robot includes a movable hand (not illustrated) that holds one substrate W.

The rotation mechanism 81 includes two shafts 81A facing each other. Each of the two shafts 81A penetrates through the posture turning tank 79. The rotation mechanism 81 holds the in-tank carrier 77 by sandwiching the in-tank carrier 77 between the two shafts 81A. Further, the rotation mechanism 81 can rotate the in-tank carrier 77 held by the two shafts 81A about a horizontal axis AX5 of the shaft 81A.

The pusher mechanism 83 includes a pusher 83A that holds lower portions of a plurality of (for example, twenty-five) substrates W in a vertical posture. The pusher mechanism 83 can lift and lower the pusher 83A and rotate the pusher around a vertical axis AX6 (see FIG. 6B). The horizontal pushing mechanism 85 includes a pushing member 85A that pushes one substrate W in a horizontal posture (see FIG. 8B). The pushing member 85A is moved to the right side while passing through the back opening 77B and the gateway 77A when the gateway 77A of the in-tank carrier 77 faces the right side. The lifter LF8, the rotation mechanism 81, the pusher mechanism 83, and the horizontal pushing mechanism 85 are each driven by at least one of an electric motor and an air cylinder.

<6-2. Operation of Second Posture Turning Mechanism>

Here, an operation of the second posture turning mechanism 67 will be described. FIG. 6A will be referred to. Fifty substrates W held in a vertical posture by the lifter LF7 are immersed in pure water in the standby tank 69. As illustrated in FIG. 3C, in the fifty substrates W, twenty-five substrates W1 and twenty-five substrates W2 are alternately disposed.

The selective transport mechanism WTR2 is moved to above the standby tank 69. In addition, the lifter LF7 pulls up the fifty substrates W from the pure water in the standby tank 69. Thereafter, the selective transport mechanism WTR2 receives the twenty-five substrates W1 out of the fifty substrates W from the lifter LF7 by using the pair of chucks 73 and 74. Therefore, the twenty-five substrates W2 remain in the lifter LF7. The lifter LF7 immerses the twenty-five substrates W2 in the pure water in the standby tank 69. The selective transport mechanism WTR2 transports the twenty-five substrates W1 to above the posture turning tank 79 and the pusher 83A.

Figure 6B:
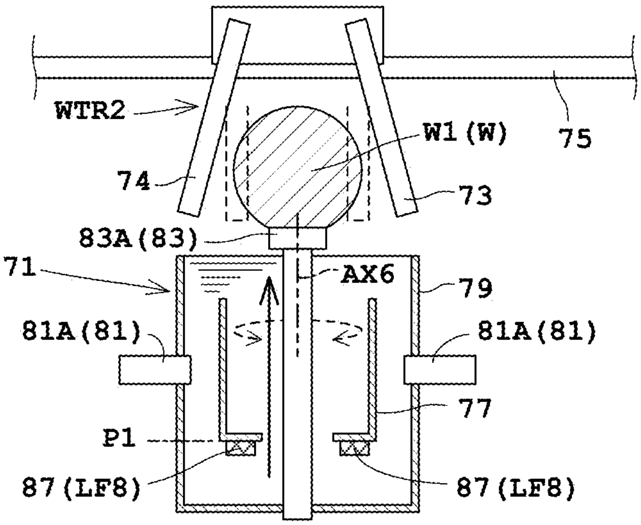

FIG. 6B will be referred to. The pusher mechanism 83 lifts the pusher 83A while allowing the pusher 83A to pass between the two carrier support portions 87 and through the back opening 77B and the gateway 77A of the in-tank carrier 77 with the gateway 77A facing upward. As a result, the pusher 83A holds the lower portions of the twenty-five substrates W1 held by the pair of chucks 73 and 74. Thereafter, the selective transport mechanism WTR2 opens the pair of chucks 73 and 74. As a result, the pusher 83A receives the twenty-five substrates W1 from the selective transport mechanism WTR2. Thereafter, the selective transport mechanism WTR2 is moved from above the pusher 83A. Thereafter, the pusher mechanism 83 adjusts the orientation of the twenty-five substrates W1 by rotating the twenty-five substrates W1 about a vertical axis AX6 such that the device surfaces face upward when the twenty-five substrates W1 are turned into a horizontal posture.

Figure 6C:
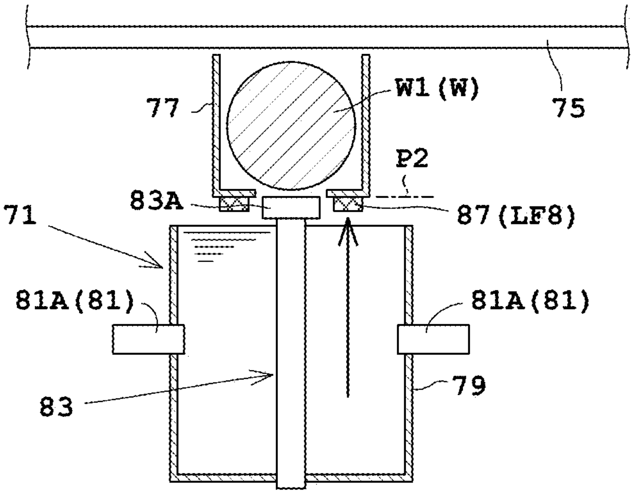

FIG. 6C will be referred to. The lifter LF8 lifts the two carrier support portions 87 supporting the in-tank carrier 77 with the gateway 77A facing upward from a position P1 to a position P2. As a result, the twenty-five substrates W1 held by the pusher 83A are stored in the in-tank carrier 77. The position P2 is a position pulled up from the pure water in the in-tank carrier 77.

Figure 7A:
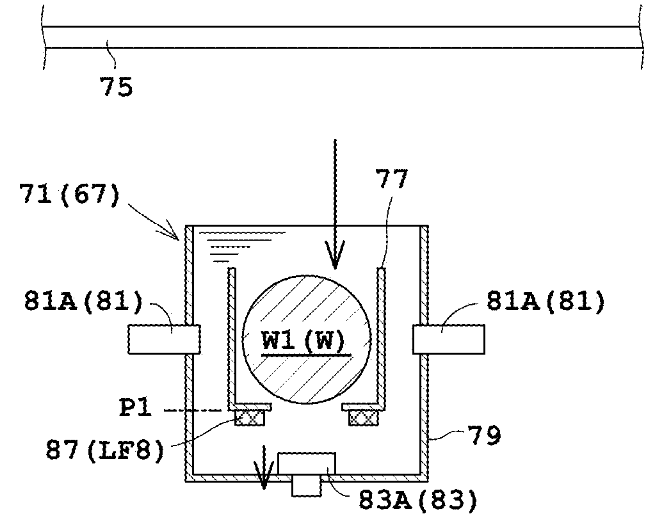
FIGS. 7A to 7C are diagrams for describing the second posture turning mechanism.

FIG. 7A will be referred to. Thereafter, the pusher mechanism 83 lowers the pusher 83A to the bottom surface in the posture turning tank 79. The lifter LF8 lowers the two carrier support portions 87 from the position P2 to the position P1. As a result, the twenty-five substrates W1 stored in the in-tank carrier 77 are immersed in pure water in the posture turning tank 79.

Figure 7B:
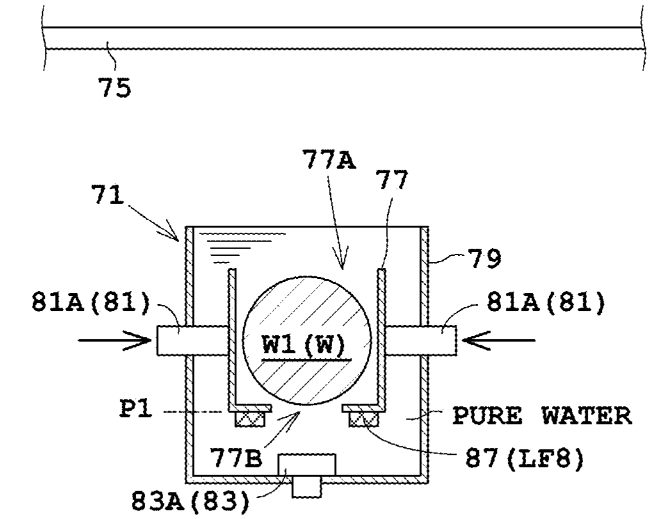
Figure 7C:
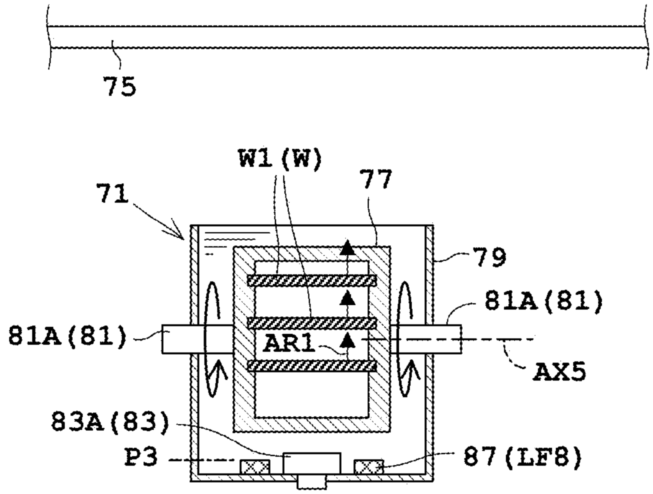

FIG. 7B will be referred to. Thereafter, the rotation mechanism 81 holds the in-tank carrier 77 with the two shafts 81A. FIG. 7C will be referred to. Thereafter, the lifter LF8 lowers the two carrier support portions 87 from the position P1 to a position P3. As a result, the in-tank carrier 77 is held by only the two shafts 81A. The position P3 is a position near the bottom surface in the posture turning tank 79. Thereafter, the rotation mechanism 81 rotates the in-tank carrier 77 by 90 degrees about the horizontal axis AX5. As a result, the twenty-five substrates W1 in the in-tank carrier 77 are turned from the vertical posture to the horizontal posture. In this case, the device surface of each substrate W1 faces upward.

Figure 8A:
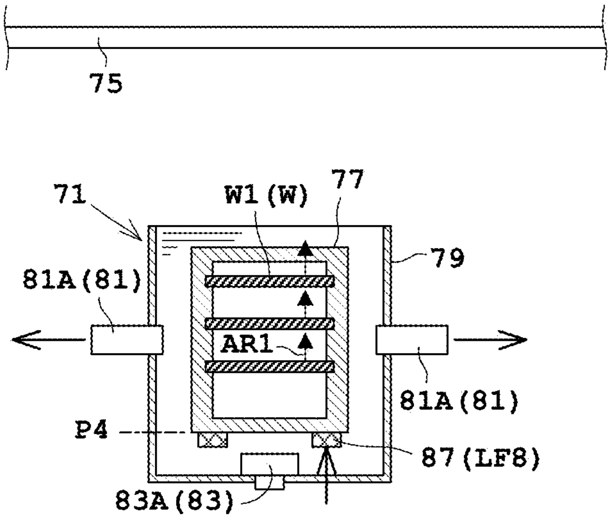
FIGS. 8A and 8B are diagrams for describing the second posture turning mechanism.

FIG. 8A will be referred to. Thereafter, the lifter LF8 lifts the two carrier support portions 87 from the position P3 to a position P4. As a result, the two carrier support portions 87 come into contact with the lower surface of the in-tank carrier 77. Thereafter, the rotation mechanism 81 separates the two shafts 81A from the in-tank carrier 77. As a result, the in-tank carrier 77 is held by only the two carrier support portions 87.

Figure 8B:
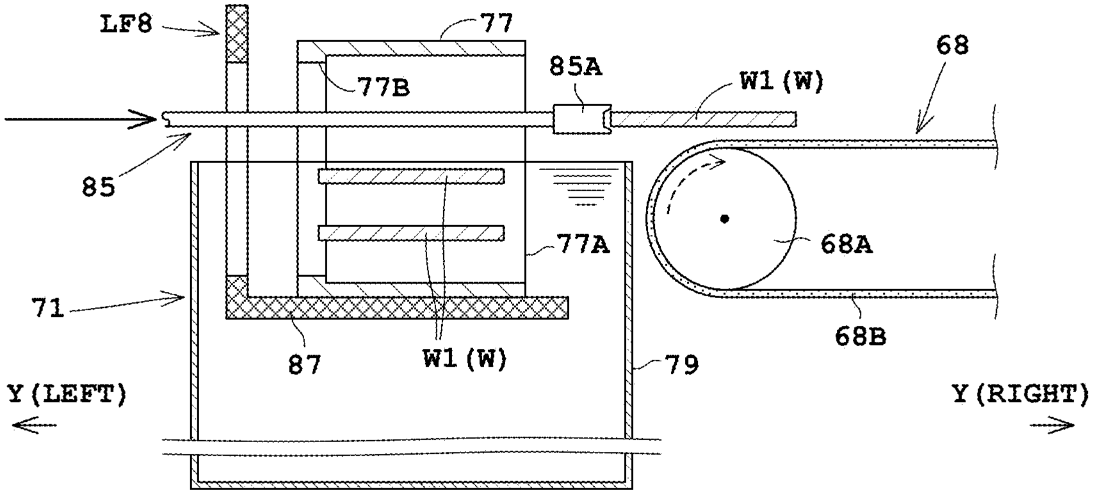

FIG. 8B will be referred to. Thereafter, the lifter LF8 lifts the two carrier support portions 87 such that the substrate W1 comes out of the pure water in the posture turning tank 79. Thereafter, the horizontal pushing mechanism 85 pushes one substrate W1 taken out from pure water by the pushing member 85A to the right side. The pushed substrate W1 is transported onto the two belts 68B of the direction turning belt conveyor 68. The direction turning belt conveyor 68 turns the transport direction of one substrate W1 from the right side to the front side. Thereafter, the direction turning belt conveyor 68 transports the one substrate W1 to a belt conveyor 101 (described later) of the single-wafer treatment device 3.

Thereafter, after the twenty-five substrates W1 are transported from the in-tank carrier 77, the remaining twenty-five substrates W2 immersed in the pure water in the standby tank 69 are turned into a horizontal posture. The posture turning of the twenty-five substrates W2 is performed in the same manner as the posture turning of the twenty-five substrates W1 (see FIGS. 6A to 8B).

<7. Single-Wafer Treatment Device>

FIG. 1 will be referred to again. The single-wafer treatment device 3 performs predetermined single-wafer treatment on a plurality of (for example, twenty-five or fifty) substrates W received from the interface device 5 one by one. The single-wafer treatment device 3 transports the plurality of substrates W subjected to the single-wafer treatment to the carrier C transported to the shelf 15A. The single-wafer treatment device 3 is adjacent to the rear side of the stocker device 2 and is adjacent to the front side of the interface device 5. The single-wafer treatment device 3 includes a single-wafer transport region R5, a first single-wafer treatment region R6, and a second single-wafer treatment region R7.

Each of the three regions R5, R6, and R7 is provided to extend the rear side or in the front-rear direction X. The second single-wafer treatment region R7, the single-wafer transport region R5, and the first single-wafer treatment region R6 are disposed side by side in this order on the left side which is the horizontal direction orthogonal to the rear side. That is, the first single-wafer treatment region R6 is adjacent to the left side of the single-wafer transport region R5. The second single-wafer treatment region R7 is adjacent to the right side of the single-wafer transport region R5. The rear side corresponds to a first direction of the present invention. The left side corresponds to a second direction of the present invention.

First, the two single-wafer treatment regions R6 and R7 will be described. The first single-wafer treatment region R6 includes a rear tower TW1, a front tower TW2, and a substrate transport robot CR1. The front tower TW2, the substrate transport robot CR1, and the rear tower TW1 are disposed in this order along the single-wafer transport region R5.

The rear tower TW1 is disposed on the rear side of the substrate transport robot CR1. The front tower TW2 is disposed on the front side of the substrate transport robot CR1. As illustrated in FIG. 2, the rear tower TW1 includes one first single-wafer treatment chamber SW1 and two second single-wafer treatment chambers SW2 stacked in the vertical direction Z. The front tower TW2 includes three second single-wafer treatment chambers SW2 stacked in the vertical direction Z. That is, the first single-wafer treatment region R6 includes a total of six single-wafer treatment chambers (the first single-wafer treatment chamber SW1 and the second single-wafer treatment chambers SW2).

The substrate transport robot CR1 includes a hand 91, an advance/retract portion 92, and an elevation rotation portion 93. The hand 91 holds one substrate W. The advance/retract portion 92 advances and retracts the hand 91. The elevation rotation portion 93 lifts and lowers the hand 91 and the advance/retract portion 92. The elevation rotation portion 93 rotates the hand 91 and the advance/retract portion 92 about a vertical axis AX7 to change an orientation of the hand 91. The elevation rotation portion 93 is fixed to a floor surface, and the elevation rotation portion 93 does not move in the horizontal direction. The substrate transport robot CR1 transports the substrate W between the three single-wafer treatment chambers (the first single-wafer treatment chamber SW1 and the second single-wafer treatment chambers SW2) of the rear tower TW1 and the three second single-wafer treatment chambers SW2 of the front tower TW2.

Similarly to the first single-wafer treatment region R6, the second single-wafer treatment region R7 includes a rear tower TW1, a front tower TW2, and a substrate transport robot CR2. That is, the second single-wafer treatment region R7 includes six single-wafer treatment chambers (a first single-wafer treatment chamber SW1 and second single-wafer treatment chambers SW2). The substrate transport robot CR2 is configured similarly to the substrate transport robot CR1. The type and number of single-wafer treatment chambers included in the rear tower TW1 and the front tower TW2 are set as appropriate.

The first single-wafer treatment chamber SW1 includes, for example, a holding rotation unit 94 and a nozzle 95. The holding rotation unit 94 includes a spin chuck that holds one substrate W in a horizontal posture and an electric motor that rotates the spin chuck about a vertical axis passing through the center of the substrate W. The nozzle 95 supplies a treatment solution onto the substrate W held by the holding rotation unit 94. As the treatment solution, for example, pure water (for example, DIW) and isopropyl alcohol (IPA) are used. The first single-wafer treatment chamber SW1 performs, for example, washing treatment on the substrate W with pure water, and then forms a liquid film of IPA on the upper surface of the substrate W.

Each of the second single-wafer treatment chambers SW2 performs, for example, drying treatment with a supercritical fluid. For example, carbon dioxide is used as the fluid. In a case where the fluid is carbon dioxide, a supercritical state is obtained when the critical temperature is 31° C. and the critical pressure is 7.38 MPa. By performing the drying treatment with the supercritical fluid, it is possible to make the pattern collapse in the substrate W less likely to occur.

The second single-wafer treatment chamber SW2 includes a chamber body (container) 96, a support tray 97, and a lid portion. The chamber body 96 includes a treatment space provided inside, an opening for inserting the substrate W into the treatment space, a supply port, and an exhaust port. The substrate W is accommodated in the treatment space while being supported by the support tray 97. The lid portion closes the opening of the chamber body 96. For example, each of the second single-wafer treatment chambers SW2 brings the fluid into the supercritical state, and supplies the supercritical fluid from the supply port to the treatment space in the chamber body 96. The drying treatment is performed on one substrate W by using the supercritical fluid supplied to the treatment space.

Next, the single-wafer transport region R5 will be described. As illustrated in FIG. 1, the single-wafer transport region R5 includes a belt conveyor 101, four substrate transport robots CR3, CR4, CR5, and CR6, and three substrate placement portions PS1, PS2, and PS3. The belt conveyor 101 and the four substrate transport robots CR3, CR4, CR5, and CR6 each correspond to a horizontal substrate transport mechanism of the present invention.

The belt conveyor 101 includes two pulleys 103, two belts 105, and a pin lifting/lowering unit 107 (see FIG. 4). The two belts 105 are stretched around the two pulleys 103. The pin lifting/lowering unit 107 is provided at the front portion of the belt conveyor 101. The pin lifting/lowering unit 107 has three lift pins PN, and lifts one substrate W on the two belts 105 by using the three lift pins PN. At least one of the two pulleys 103 and the pin lifting/lowering unit 107 are each driven by an electric motor.

Each of the four substrate transport robots CR3 to CR6 is configured similarly to the substrate transport robot CR1. The substrate transport robot CR4 preferably includes two hands 91. In this case, the first hand 91 is used to transport the wet substrate W, and the second hand 91 is used to transport the substrate W dried in the second single-wafer treatment chamber SW2. Each of the three substrate placement portions PS1 to PS3 is configured to place one or two or more substrates W thereon.

The belt conveyor 101, the substrate transport robot CR3, the substrate transport robot CR4, the substrate transport robot CR5, and the substrate transport robot CR6 are disposed to face the front side in this order. The substrate placement portion PS1 is disposed between the two substrate transport robots CR3 and CR4. The substrate placement portion PS2 is disposed between the two substrate transport robots CR4 and CR5. The substrate placement portion PS3 is disposed between the two substrate transport robots CR5 and CR6.

The belt conveyor 101 extends to the rear side up to the direction turning belt conveyor 68 of the interface device 5. The belt conveyor 101 receives the substrate W from the second posture turning mechanism 67 via the direction turning belt conveyor 68. The belt conveyor 101 moves the substrate W to above the pin lifting/lowering unit 107 through belt transport. The substrate transport robot CR3 transports the substrate W between the pin lifting/lowering unit 107 of the belt conveyor 101 and the substrate placement portion PS1.

The substrate transport robot CR4 transports the substrates W between the two substrate placement portions PS1 and PS2 and the six single-wafer treatment chambers (the first single-wafer treatment chamber SW1 and the second single-wafer treatment chambers SW2) of the two rear towers TW1. In addition, the substrate transport robot CR5 transports the substrate W between the two substrate placement portions PS2 and PS3 and the six second single-wafer treatment chambers SW2 of the two front towers TW2. The substrate transport robot CR6 transports the substrate W between the substrate placement portion PS3 and the carrier C placed on the shelf 15A.

<8. Control Unit>

The substrate treatment system 1 includes a control unit 110 (see FIG. 1) and a storage unit (not illustrated). The control unit 110 controls each constituent of the substrate treatment system 1. The control unit 110 includes one or more processors such as a central processing unit (CPU). The storage unit includes, for example, at least one of a read-only memory (ROM), a random-access memory (RAM), and a hard disk. The storage unit stores a computer program necessary for controlling each constituent of the substrate treatment system 1.

<9. Operation of Substrate Treatment System>

Figure 9:
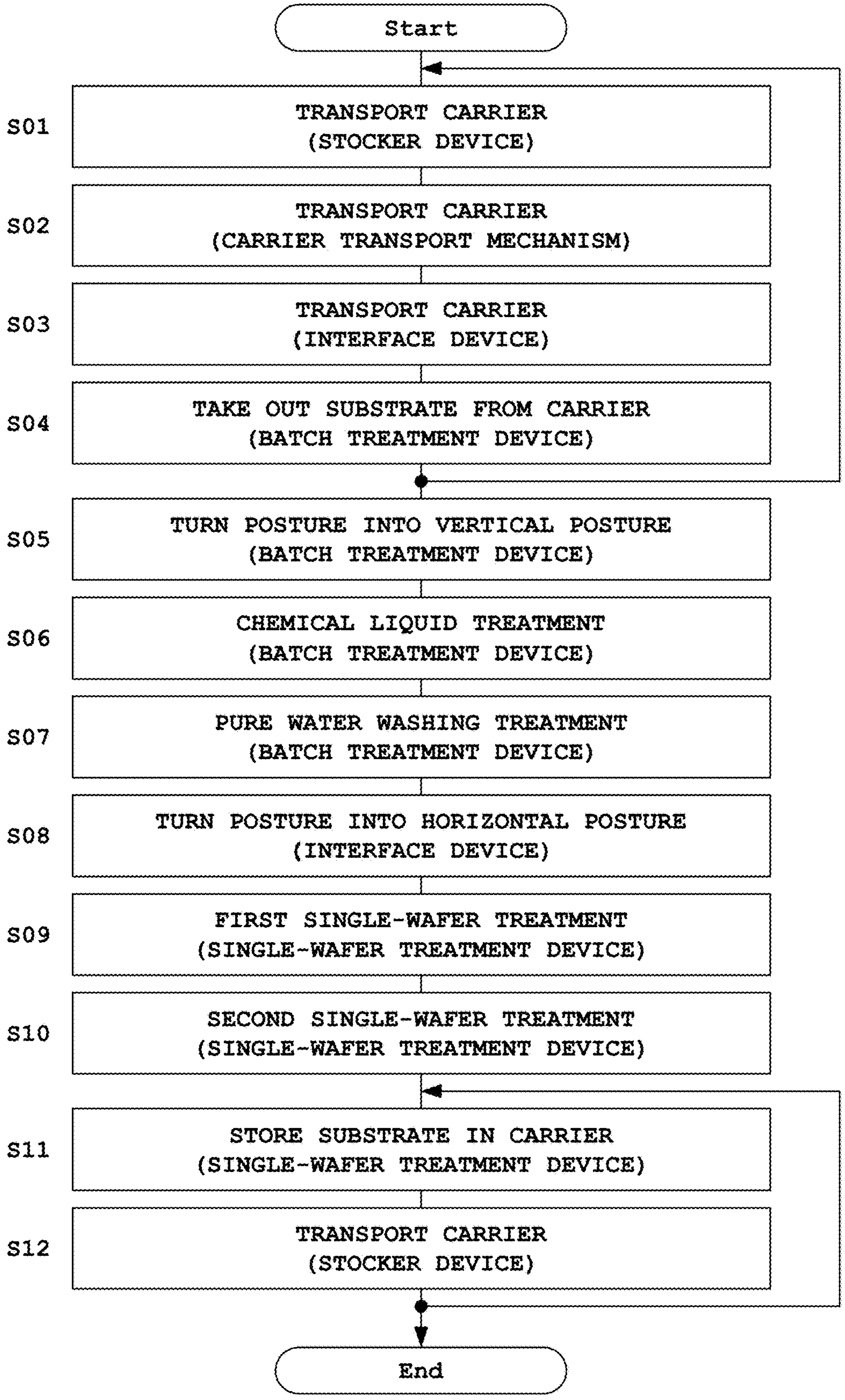
FIG. 9 is a flowchart for describing an operation of the substrate treatment system.

Next, an operation of the substrate treatment system 1 will be described with reference to a flowchart of FIG. 9. FIG. 1 will be referred to. An external transport robot (not illustrated) transports two carriers C to the load port 11.

[Step S01] Transporting Carrier (Stocker Device)

The first transport robot 17 of the stocker device 2 does not transport the first carrier C to the shelf 15A that can be accessed by the substrate transport robot CR6 of the single-wafer treatment device 3. This is because there is a possibility that the throughput of the substrate treatment system 1 decreases due to the substrate W passing through the single-wafer treatment device 3. Instead, the carrier C is transported from the stocker device 2 to the interface device 5 adjacent to the batch treatment device 7 in a state in which the substrate W before treatment (untreated) is stored.

A specific description will be made. The first transport robot 17 of the stocker device 2 transports the first carrier C placed on the load port 11 to the stocker device side position PT1. The carrier transport mechanism 9 uses the placement table 23 to receive the first carrier C transported to the stocker device side position PT1 from the first transport robot 17.

[Step S02] Transporting Carrier (Carrier Transport Mechanism)

The carrier transport mechanism 9 transports the first carrier C from the stocker device side position PT1 to the interface device side position PT2 by moving the placement table 23 to the rear side.

[Step S03] Transporting Carrier (Interface Device)

The second transport robot 31 of the interface device 5 transports the first carrier C from the interface device side position PT2 to the shelf 29. That is, the second transport robot 31 grips the first carrier C on the placement table 23 and transports the gripped first carrier C to the shelf 29.

[Step S04] Taking Out Substrate From Carrier

The substrate handling mechanism HTR of the transfer block 37 of the batch treatment device 7 takes out the twenty-five substrates W1 (first substrate group) from the first carrier C transported to the shelf 29, and transports the twenty-five substrates W1 to the posture turning unit 51.

Thereafter, the second transport robot 31 of the interface device 5 transports the first carrier C (empty carrier) from which the twenty-five substrates W1 have been taken out from the shelf 29 to the interface device side position PT2. The carrier transport mechanism 9 receives the first carrier C by using the placement table 23. Thereafter, the carrier transport mechanism 9 transports the first carrier C (empty carrier) from the interface device side position PT2 to the stocker device side position PT1 by moving the placement table 23 to the front side. Thereafter, the first transport robot 17 of the stocker device 2 transports the first carrier C (empty carrier) from the stocker device side position PT1 to the shelf 15A. That is, the first transport robot 17 grips the first carrier C on the placement table 23 and transports the gripped first carrier C to the shelf 15A.

Thereafter, the operations in steps S01 to S04 are performed on the second carrier C. That is, the first transport robot 17 transports the second carrier C placed on the load port 11 to the stocker device side position PT1. The carrier transport mechanism 9 receives the second carrier C by using the placement table 23. The carrier transport mechanism 9 transports the second carrier C from the stocker device side position PT1 to the interface device side position PT2 by moving the placement table 23 to the rear side.

Thereafter, the second transport robot 31 grips the second carrier C on the placement table 23 and transports the gripped second carrier C from the interface device side position PT2 to the shelf 29. The substrate handling mechanism HTR of the batch treatment device 7 takes out the twenty-five substrates W2 (second substrate group) from the second carrier C transported to the shelf 29, and transports the twenty-five substrates W2 to the posture turning unit 51.

Thereafter, the second transport robot 31 transports the second carrier C (empty carrier) from which the twenty-five substrates W2 have been taken out to the interface device side position PT2 from the shelf 29. The carrier transport mechanism 9 uses the placement table 23 to receive the second carrier C (empty carrier) from the second transport robot 31. The carrier transport mechanism 9 transports the second carrier C (empty carrier) from the interface device side position PT2 to the stocker device side position PT1 by moving the placement table 23 to the front side. The first transport robot 17 grips the second carrier C on the placement table 23 and transports the gripped second carrier C from the stocker device side position PT1 to the storage shelf 15B. The second carrier C (empty carrier) is stored on the shelf 15B until the second carrier C can be transported to the shelf 15A.

[Step S05] Turning Posture Into Vertical Posture

As illustrated in FIGS. 3A to 3C, the posture turning unit 51 individually turns the twenty-five substrates W1 and the twenty-five substrates W2 from a horizontal posture to a vertical posture. In addition, the pusher 53A of the pusher mechanism 53 holds the fifty substrates W (substrates W1 and W2) in which the twenty-five substrates W1 and the twenty-five substrates W2 are alternately disposed in a vertical posture. Thereafter, the pusher mechanism 53 transports the fifty substrates W to the substrate delivery position PP.

[Step S06] Chemical Liquid Treatment

The batch transport mechanism WTR1 receives the fifty substrates W in a vertical posture from the pusher mechanism 53 at the substrate delivery position PP, and transports the fifty substrates W to one of the two lifters LF1 and LF3 of the two chemical liquid treatment tanks BT1 and BT3.

For example, the batch transport mechanism WTR1 transports the fifty substrates W to the lifter LF1 of the chemical liquid treatment tank BT1. The lifter LF1 receives the fifty substrates W at a position above the chemical liquid treatment tank BT1. The lifter LF1 immerses the fifty substrates W in a chemical liquid (for example, phosphoric acid) in the chemical liquid treatment tank BT1. As a result, etching treatment (batch treatment) is performed. After the etching treatment, the lifter LF1 pulls up the fifty substrates W from the phosphoric acid in the chemical liquid treatment tank BT1. In a case where the fifty substrates W are transported to the lifter LF3 of another chemical liquid treatment tank BT3, the same treatment as in the chemical liquid treatment tank BT1 is performed.

[Step S07] Pure Water Washing Treatment

The batch transport mechanism WTR1 receives, for example, the fifty substrates W in a vertical posture from the lifter LF1, and transports the fifty substrates W to the lifter LF2 of the water washing treatment tank BT2. The lifter LF2 receives the fifty substrates W at a position above the water washing treatment tank BT2. The lifter LF2 immerses the fifty substrates W in pure water in the water washing treatment tank BT2. Accordingly, washing treatment (batch treatment) is performed.

In a case where the batch transport mechanism WTR1 receives the fifty substrates W in the vertical posture from the lifter LF3, the batch transport mechanism WTR1 transports the fifty substrates W to the lifter LF4 of the water washing treatment tank BT4. The lifter LF4 immerses the fifty substrates W in pure water in the water washing treatment tank BT4.

[Step S08] Turning Posture Into Horizontal Posture

The batch transport mechanism WTR1 receives the fifty substrates W subjected to the pure water washing treatment from one of the two lifters LF2 and LF4. When the fifty substrates W are transported, for example, the lifter LF2 pulls up the fifty substrates W from the pure water in the water washing treatment tank BT2. The batch transport mechanism WTR1 transports the received fifty substrates W to the lifter LF7 of the standby tank 69 of the interface device 5 across the substrate delivery position PP of the first posture turning mechanism 41. The lifter LF7 receives the fifty substrates W at a position above the standby tank 69.

As illustrated in FIGS. 6A to 8B, the underwater posture turning unit 71 individually turns the twenty-five substrates W1 and the twenty-five substrates W2 from a vertical posture to a horizontal posture. The underwater posture turning unit 71 transports the twenty-five substrates W1 (the twenty-five substrates W2) turned into the horizontal posture one by one to the direction turning belt conveyor 68. The direction turning belt conveyor 68 turns a transport direction of one substrate W from the right side to the front side, and transports the transported one substrate W to the belt conveyor 101 of the single-wafer treatment device 3.

[Step S09] First Single-Wafer Treatment

The belt conveyor 101 transports one substrate W to the pin lifting/lowering unit 107. The pin lifting/lowering unit 107 lifts the one substrate W from the two belts 105. The substrate transport robot CR3 receives one substrate W from the pin lifting/lowering unit 107, and transports the one substrate W to the substrate placement portion PS1 in a horizontal posture. Thereafter, the substrate transport robot CR4 uses the first hand 91 out of the two hands 91 to receive one wet substrate W from the substrate placement portion PS1. Then, the substrate transport robot CR4 transports the substrate W received by the first hand 91 to one of the two first single-wafer treatment chambers SW1 of the two rear towers TW1.

Each of the first single-wafer treatment chambers SW1 holds and rotates the substrate W with the device surface facing upward by the holding rotation unit 94, and supplies pure water from the nozzle 95 to the device surface. Thereafter, each first single-wafer treatment chamber SW1 supplies IPA from the nozzle 95 to the device surface (upper surface) of the substrate W, and replaces the pure water of the substrate W with IPA.

[Step S10] Second Single-Wafer Treatment (Drying Treatment)

It is assumed that the substrate W is subjected to treatment in the first single-wafer treatment chamber SW1 of the first single-wafer treatment region R6. In this case, the substrate transport robot CR1 transports the substrate W subjected to replacement with IPA from the first single-wafer treatment chamber SW1 of the first single-wafer treatment region R6 to any one of the five second single-wafer treatment chambers SW2 of the first single-wafer treatment region R6. Similarly, it is assumed that the substrate W is subjected to treatment in the first single-wafer treatment chamber SW1 of the second single-wafer treatment region R7. In this case, the second substrate transport robot CR2 transports the substrate W subjected to replacement with IPA from the first single-wafer treatment chamber SW1 of the second single-wafer treatment region R7 to any one of the five second single-wafer treatment chambers SW2 of the second single-wafer treatment region R7.

Each of the second single-wafer treatment chambers SW2 performs drying treatment on one substrate W with carbon dioxide (supercritical fluid) in a supercritical state. The pattern collapse of a pattern surface (device surface) of the substrate W is curbed due to the drying treatment using the supercritical fluid.

[Step S11] Storing Substrate in Carrier

It is assumed that drying treatment is performed in any one of the six second single-wafer treatment chambers SW2 of the two front towers TW2 of the two single-wafer treatment regions R6 and R7. In this case, the substrate transport robot CR5 transports one substrate W subjected to the drying treatment from the second single-wafer treatment chamber SW2 subjected to the drying treatment to the substrate placement portion PS3.

In addition, it is assumed that the drying treatment is performed in any one of the four second single-wafer treatment chambers SW2 of the two rear towers TW1 of the two single-wafer treatment regions R6 and R7. In this case, the substrate transport robot CR4 uses the second hand 91 out of the two hands 91 to receive one substrate W from the second single-wafer treatment chamber SW2 subjected to the drying treatment. Then, the substrate transport robot CR4 transports the substrate W received by the second hand 91 to the substrate placement portion PS2. Thereafter, the substrate transport robot CR5 transports the substrate W subjected to the drying treatment from the substrate placement portion PS2 to the substrate placement portion PS3.

The substrate transport robot CR6 transports the substrate W1 from the substrate placement portion PS3 to the first carrier C placed on the shelf 15A.

[Step S12] Transporting Carrier (Stocker Device)

When the twenty-five substrates W1 are stored in the first carrier C, the first transport robot 17 transports the first carrier C from the shelf 15A to one of the two load ports 11. In addition, the first transport robot 17 transports the second carrier C (empty carrier) from the shelf 15B to the shelf 15A after the first carrier C is transported.

Thereafter, the operations in steps S11 and S12 are performed on the second carrier C. The substrate transport robot CR6 transports the substrate W2 from the substrate placement portion PS3 to the second carrier C placed on the shelf 15A. When the twenty-five substrates W2 are stored in the second carrier C, the first transport robot 17 transports the second carrier C from the shelf 15A to one of the two load ports 11. An external transport mechanism (not illustrated) sequentially transports the two carriers C from the load port 11 to the next destination.

According to the present embodiment, the stocker device 2, the single-wafer treatment device 3, the interface device 5, and the batch treatment device 7 are disposed in a line and linearly in this order. In such a configuration, the carrier transport mechanism 9 transports the carrier C between the stocker device side position PT1 on the stocker device 2 side and the interface device side position PT2 on the interface device 5 side. Therefore, the substrate W can be transported from the stocker device 2 to the interface device 5 in units of carriers. Thus, it is possible to prevent a decrease in throughput due to the substrate W passing through the single-wafer treatment device 3. In addition, since the substrate W is stored in the carrier C, it is possible to prevent particles from adhering to the substrate W when the substrate W is transported from the stocker device 2 to the interface device 5.

In addition, the batch treatment device 7 includes the posture turning unit 51. The interface device 5 includes the underwater posture turning unit 71. Thus, the batch treatment device 7 can perform predetermined batch treatment on a plurality of substrates W turned into a vertical posture. In addition, the single-wafer treatment device 3 can perform predetermined single-wafer treatment on a plurality of substrates W turned into a horizontal posture in the interface device 5 one by one.

in addition, the batch treatment device 7 includes the transfer block 37 adjacent to the shelf 29 and the treatment block 39 adjacent to the transfer block 37. Such a disposition is similar to that of a general batch-type substrate treatment device. In addition, in a general batch-type substrate treatment device, posture turning is generally performed in the transfer block 37 including the substrate handling mechanism HTR. According to the present invention, one end of the batch substrate transport region R4 extends to the inside of the interface device 5, and the other end of the batch substrate transport region R4 extends to the rear side. Further, the batch transport mechanism WTR1 of the batch substrate transport region R4 transports the plurality of substrates W from, for example, the two batch treatment tanks BT2 and BT4 (treatment block 39) to the second posture turning mechanism 67 (interface device 5) in a vertical posture while exceeding the first posture turning mechanism 41 (transfer block 37). Therefore, the plurality of substrates W can be efficiently transported.

In addition, the carrier transport mechanism 9 is provided above the single-wafer treatment device 3 to overlap the single-wafer treatment device 3 in a plan view. As a result, the single-wafer treatment device 3 can increase a region in which the single-wafer treatment is performed. That is, the single-wafer treatment device 3 can include more single-wafer treatment chambers (the first single-wafer treatment chamber SW1 and the second single-wafer treatment chambers SW2). Therefore, the throughput can be improved.

Second Embodiment

Figure 10:
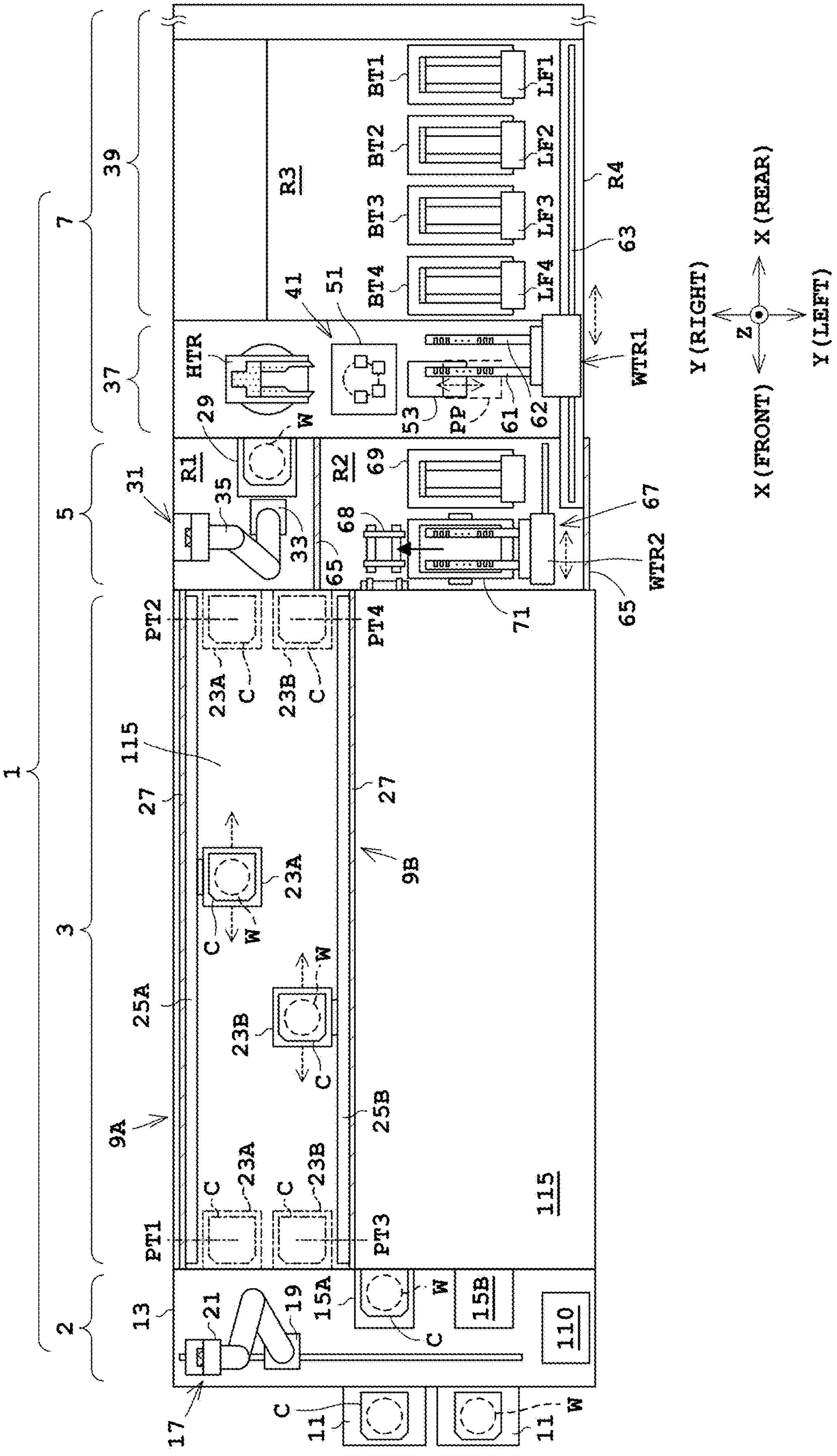
FIG. 10 is a plan view of a substrate treatment system according to a second embodiment.

Next, a second embodiment of the present invention will be described with reference to the drawings. Note that the description overlapping with the first embodiment will be omitted. FIG. 10 is a plan view of a substrate treatment system 1 according to the second embodiment. In FIG. 10, it is assumed that, for example, the rear towers TW1, the front towers TW2, and the six substrate transport robots CR1 to CR6 are hidden by a ceiling wall 115.

The substrate treatment system 1 of the first embodiment includes the single carrier transport mechanism 9. In contrast, the substrate treatment system 1 of the second embodiment may include a plurality of (for example, two) carrier transport mechanisms 9A and 9B.

The two carrier transport mechanisms 9A and 9B are disposed side by side in the width direction Y. Each of the two carrier transport mechanisms 9A and 9B is provided above the single-wafer treatment device 3 to overlap a part or the whole of the single-wafer treatment device 3 in a plan view. Each of the two carrier transport mechanisms 9A and 9B is configured similarly to the carrier transport mechanism 9 of the first embodiment. That is, the first carrier transport mechanism 9A includes the placement table 23A and the table movement portion 25A. Similarly, the second carrier transport mechanism 9B includes the placement table 23B and the table movement portion 25B.

The first carrier transport mechanism 9A transports the carrier C between the stocker device side position PT1 on the stocker device 2 side and the interface device side position PT2 on the interface device 5 side. In addition, the second carrier transport mechanism 9B transports the carrier C between the stocker device side position PT3 on the stocker device 2 side and the interface device side position PT4 on the interface device 5 side. Note that the two carrier transport mechanisms 9A and 9B correspond to a carrier transport mechanism and a second carrier transport mechanism of the present invention.

The first transport robot 17 transports the carrier C to the placement table 23A moved to a predetermined position on the stocker device 2 side. Similarly, the first transport robot 17 transports the carrier C to the placement table 23B moved to a predetermined position on the stocker device 2 side. The second transport robot 31 transports the carrier C to the placement table 23A moved to a predetermined position on the interface device 5 side. Similarly, the second transport robot 31 transports the carrier C to the placement table 23B moved to a predetermined position on the interface device 5 side.

For example, the first carrier transport mechanism 9A transports the first carrier C storing the substrate W before treatment from the stocker device side position PT1 to the interface device side position PT2. In addition, the first carrier transport mechanism 9A transports the empty first carrier C from the interface device side position PT2 to the stocker device side position PT1. Note that "before treatment" indicates that any treatment is not performed in the substrate treatment system 1.

The second carrier transport mechanism 9B transports the second carrier C storing the substrate W before treatment from the stocker device side position PT3 to the interface device side position PT4. In addition, the second carrier transport mechanism 9B transports the empty second carrier C from the interface device side position PT4 to the stocker device side position PT3.

As another transport example, the first carrier transport mechanism 9A may transport only the carrier C storing the substrate W before treatment. In addition, the second carrier transport mechanism 9B may transport only the empty carrier C.

The substrate treatment system 1 of the present embodiment includes a plurality of (for example, two) carrier transport mechanisms 9A and 9B. Since the number of carrier transport mechanisms 9 is increased, the carrier C can be efficiently transported between the stocker device 2 and the interface device 5.

Third Embodiment

Figure 11:
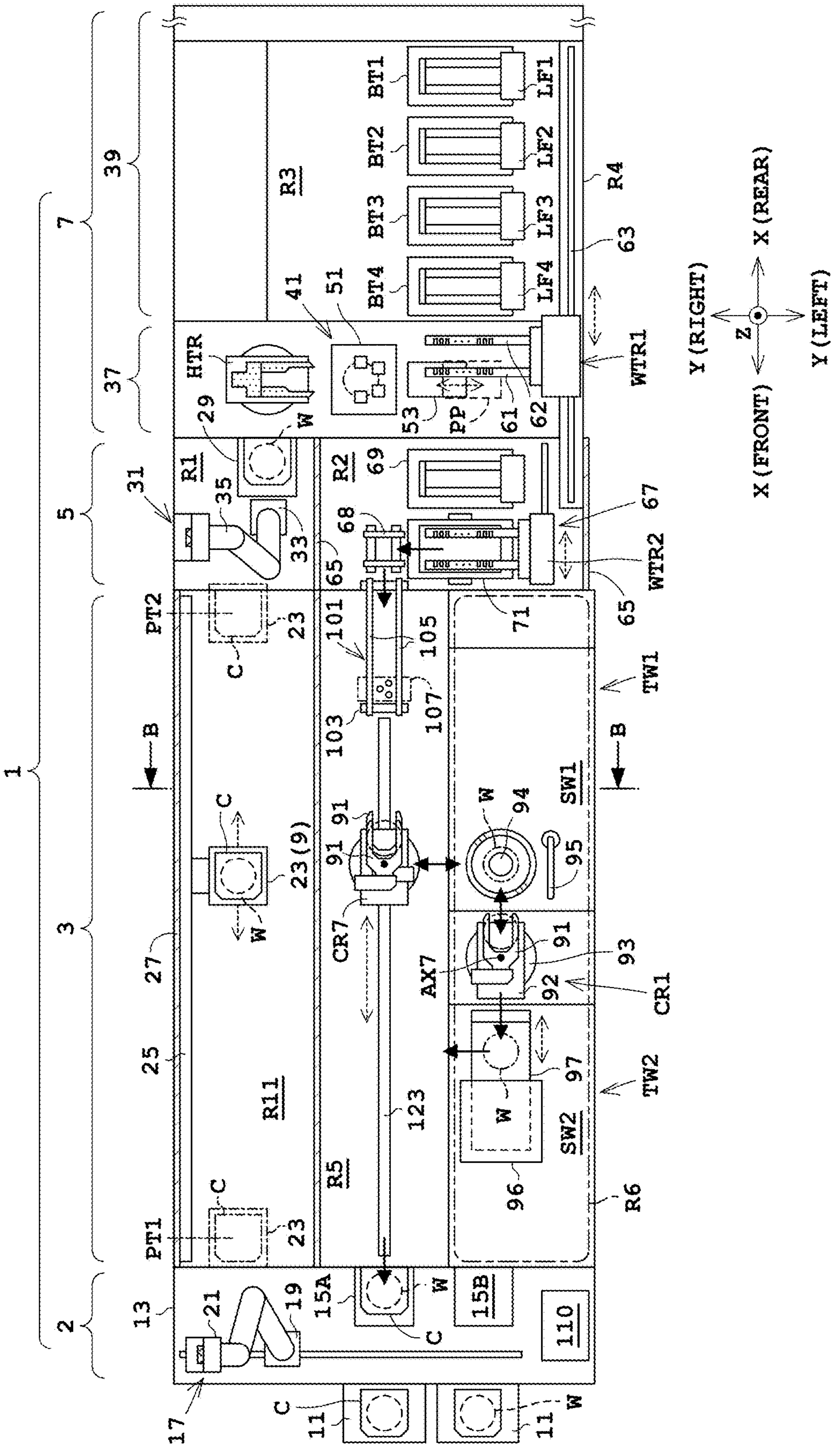
FIG. 11 is a plan view of a substrate treatment system according to a third embodiment.
Figure 12:
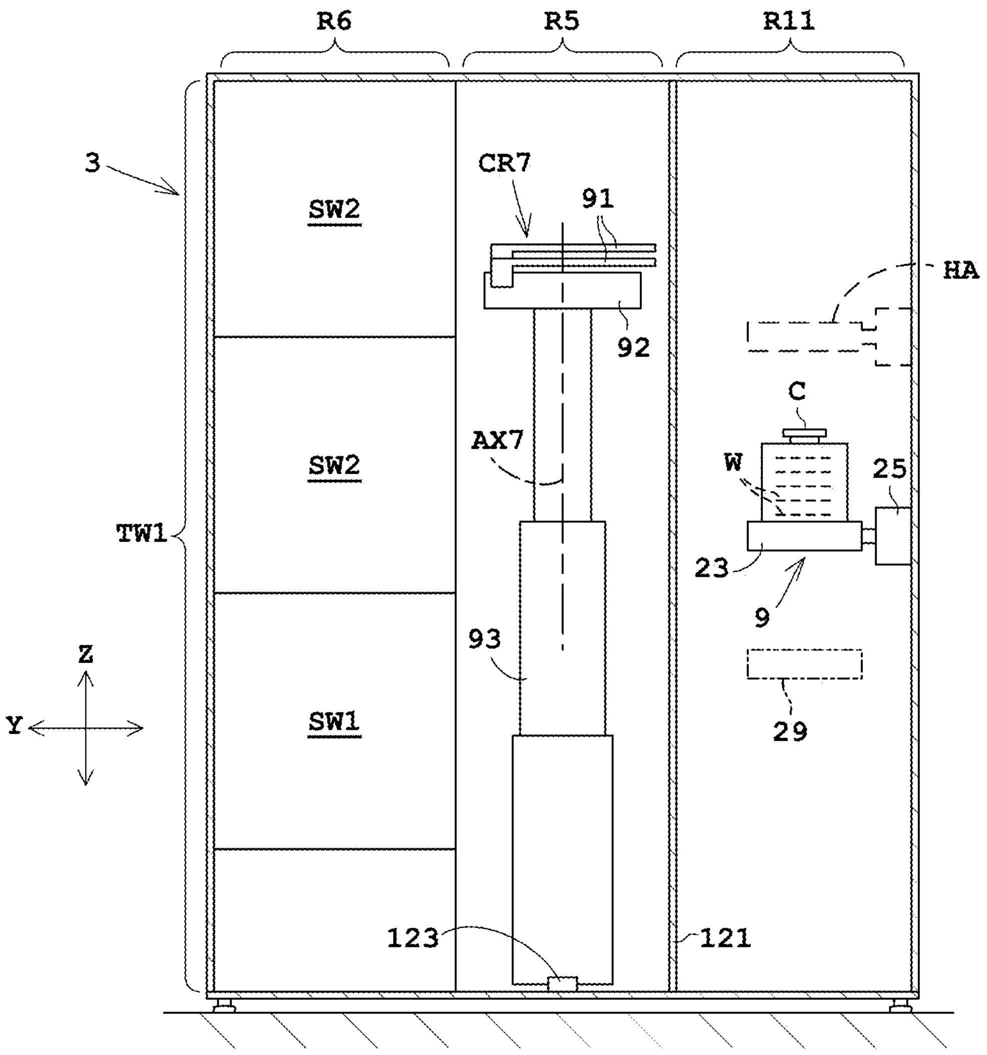
FIG. 12 is a longitudinal cross-sectional view of a single-wafer treatment device illustrated in FIG. 11 as viewed in a direction of an arrow B-B.

Next, a third embodiment of the present invention will be described with reference to the drawings. Note that description overlapping with the first and second embodiments will be omitted. FIG. 11 is a plan view of a substrate treatment system 1 according to the third embodiment. FIG. 12 is a longitudinal cross-sectional view of a single-wafer treatment device 3 illustrated in FIG. 11 as viewed in a direction of an arrow B-B.

The single-wafer treatment device 3 according to the first embodiment includes the second single-wafer treatment region R7, the single-wafer transport region R5, and the first single-wafer treatment region R6. In contrast, the single-wafer treatment device 3 of the third embodiment includes a carrier transport region R11, a single-wafer transport region R5, and a first single-wafer treatment region R6.

Each of the carrier transport region R11, the single-wafer transport region R5, and the first single-wafer treatment region R6 is provided to extend to the rear side or in the front-rear direction X. The carrier transport region R11, the single-wafer transport region R5, and the first single-wafer treatment region R6 are disposed side by side in this order on the left side which is a horizontal direction orthogonal to the rear side. In other words, the carrier transport region R11 is provided adjacent to the right side of the single-wafer transport region R5. The first single-wafer treatment region R6 is provided adjacent to the left side of the single-wafer transport region R5. A wall 121 is a wall that blocks an atmosphere between the carrier transport region R11 and the single-wafer transport region R5.

The carrier transport region R11 includes a carrier transport mechanism 9. Note that the carrier transport region R11 may include a plurality of carrier transport mechanisms 9. In this case, in FIG. 12, for example, the two carrier transport mechanisms 9 are disposed in the vertical direction Z. In FIG. 12, the second carrier transport mechanism 9 is disposed, for example, at a position indicated by a dashed line HA. The single-wafer transport region R5 includes a substrate transport robot CR7 and a belt conveyor 101. The substrate transport robot CR7 and the belt conveyor 101 transport at least one substrate W between the interface device 5, the six single-wafer treatment chambers (the first single-wafer treatment chamber SW1 and the second single-wafer treatment chambers SW2), and the carrier C transported to the shelf 15A.

Similarly to the substrate transport robot CR1, the substrate transport robot CR7 includes a hand 91, an advance/retract portion 92, and an elevation rotation portion 93. The substrate transport robot CR7 further includes a guide rail 123 extending in the front-rear direction X. The substrate transport robot CR7 (elevation rotation portion 93) is movable along the guide rail 123.

The single-wafer treatment region R6 includes a rear tower TW1, a front tower TW2, and a substrate transport robot CR1. The rear tower TW1 includes one first single-wafer treatment chamber SW1 and two second single-wafer treatment chambers SW2 disposed in the vertical direction Z. The front tower TW2 includes three second single-wafer treatment chambers SW2 disposed in the vertical direction Z.

The substrate transport robot CR7 includes, for example, two hands 91. The substrate transport robot CR7 uses the first hand 91 to transport one wet substrate W from the pin lifting/lowering unit 107 of the belt conveyor 101 to one first single-wafer treatment chamber SW1 of the rear tower TW1. The substrate transport robot CR1 of the single-wafer treatment region R6 transports one substrate W subjected to replacement with IPA from one first single-wafer treatment chamber SW1 to any one of five second single-wafer treatment chambers SW2. The substrate transport robot CR7 uses the second hand 91 to transport the one substrate W subjected to drying treatment from the second single-wafer treatment chamber SW2 in which the drying treatment has been performed to the carrier C placed on the shelf 15A.

According to the present embodiment, similarly to the substrate treatment system 1 of the first embodiment, it is possible to prevent a decrease in throughput due to the substrate W passing through the single-wafer treatment device 3. In the assembly of the substrate treatment system 1, when the carrier transport mechanism 9 is disposed above the single-wafer treatment device 3 (in the case of the first and second embodiments), it is necessary to transport the carrier transport mechanism 9 to above the single-wafer treatment device 3. According to the present embodiment, the carrier transport region R11 including the carrier transport mechanism 9 is disposed on the side of the single-wafer transport region R5 and the single-wafer treatment region R6. Therefore, the load of carrying the carrier transport mechanism 9 can be reduced, and thus the assembly of the substrate treatment system 1 can be relatively facilitated.

Each of the first transport robot 17 and the second transport robot 31 does not need to transport the carrier C to a position higher than the ceiling wall 115 of the single-wafer treatment device 3. Therefore, the carrier C can be efficiently transported between the stocker device 2 and the interface device 5. In addition, since the carrier transport region R11, the single-wafer transport region R5, and the single-wafer treatment region R6 are disposed side by side in the horizontal direction (width direction Y), it is possible to curb an increase in a length of the substrate treatment system 1 in the width direction. That is, since the second single-wafer treatment region R7 illustrated in FIG. 1 is merely replaced with the carrier transport region R11, the length of the substrate treatment system 1 in the width direction Y is not substantially changed.

Fourth Embodiment

Figure 13:
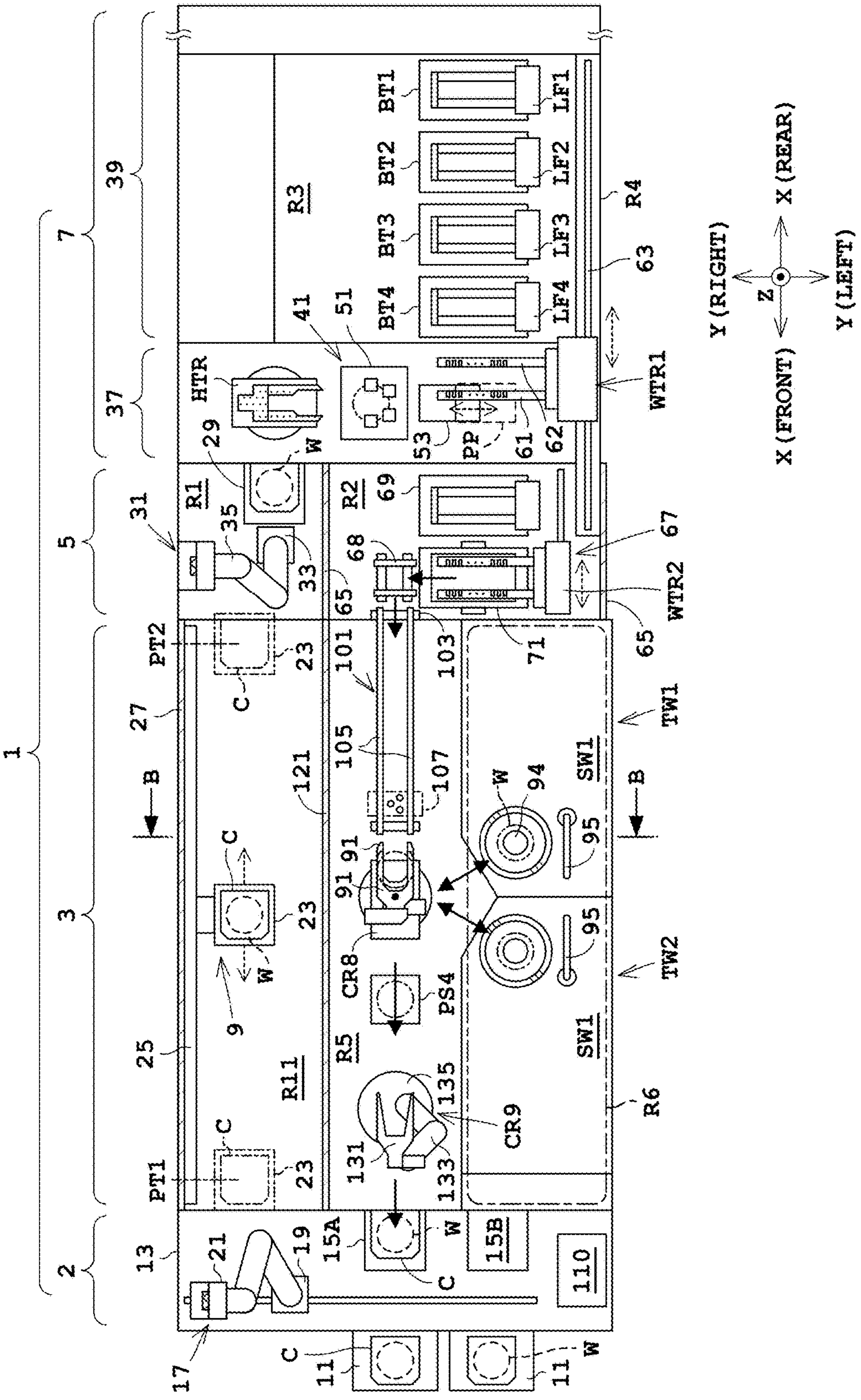
FIG. 13 is a plan view of a substrate treatment system according to a fourth embodiment.

Next, a fourth embodiment of the present invention will be described with reference to the drawings. Note that description overlapping with the first to third embodiments will be omitted. FIG. 13 is a plan view of a substrate treatment system 1 according to the fourth embodiment. Note that, in FIG. 13, a longitudinal cross-sectional view of the single-wafer treatment device 3 as viewed in the direction of the arrow B-B is substantially the same as FIG. 12.

In the third embodiment, the single-wafer treatment region R6 includes six single-wafer treatment chambers (the first single-wafer treatment chamber SW1 and the second single-wafer treatment chambers SW2). One first single-wafer treatment chamber SW1 performs treatment on one substrate W with pure water and IPA, and five second single-wafer treatment chambers SW2 each perform drying treatment on one substrate W with a supercritical fluid. In the fourth embodiment, the single-wafer treatment region R6 may include six first single-wafer treatment chambers SW1, and each of the six first single-wafer treatment chambers SW1 may perform treatment on one substrate W with pure water and IPA, and then perform spin drying.

FIG. 13 will be referred to. The single-wafer treatment device 3 includes a carrier transport region R11, a single-wafer transport region R5, and a single-wafer treatment region R6.

Each of the carrier transport region R11, the single-wafer transport region R5, and the single-wafer treatment region R6 is provided to extend to the rear side or in the front-rear direction X. The carrier transport region R11, the single-wafer transport region R5, and the single-wafer treatment region R6 are disposed side by side in this order on the left side which is a horizontal direction orthogonal to the rear side.

The single-wafer treatment region R6 includes a rear tower TW1 and a front tower TW2. Each of the rear tower TW1 and the front tower TW2 includes three first single-wafer treatment chambers SW1 disposed in the vertical direction Z. Each of the six first single-wafer treatment chambers SW1 of the rear tower TW1 and the front tower TW2 supplies, for example, pure water and IPA to the substrate W in this order, and then performs drying treatment (spin drying) on the substrate W.

The single-wafer transport region R5 includes, for example, a belt conveyor 101, two substrate transport robots CR8 and CR9, and a substrate placement portion PS4. The substrate transport robot CR8 is provided on the front side of the belt conveyor 101. The substrate transport robot CR8 is provided between the belt conveyor 101 and the substrate placement portion PS4. The substrate placement portion PS4 is disposed between the two substrate transport robots CR8 and CR9. The substrate placement portion PS4 is configured similarly to the substrate placement portion PS1. The substrate transport robot CR9 is disposed closer to the stocker device 2 than the substrate placement portion PS4.

The substrate transport robot CR8 includes a hand 91, an advance/retract portion 92, and an elevation rotation portion 93, similarly to the substrate transport robot CR1 of the first embodiment and the like. The substrate transport robot CR8 preferably includes two hands 91.

The substrate transport robot CR8 receives one substrate W from the pin lifting/lowering unit 107 of the belt conveyor 101 by using the first hand 91, and transports the one substrate W received by the first hand 91 to any one of the six first single-wafer treatment chambers SW1. In addition, the substrate transport robot CR8 uses the second hand 91 to receive one substrate W from the single-wafer treatment chamber SW1 in which the drying treatment has been performed, and transports the one substrate W received by the second hand 91 to the substrate placement portion PS4.

The substrate transport robot CR9 includes a hand 131, an articulated arm 133, and a lifting/lowering stage 135. The hand 131 holds one substrate W. The articulated arm 133 is, for example, a selective compliance assembly robot arm (SCARA) type robot arm. A basal end portion of the articulated arm 133 is attached to the lifting/lowering stage 135 to be rotatable about the vertical axis. The hand 131 is attached to a distal end portion of the articulated arm 133. The articulated arm 133 and the lifting/lowering stage 135 are each driven by an electric motor. The substrate transport robot CR9 transports the substrate W from the substrate placement portion PS4 to the carrier C placed on the shelf 15A.

According to the present embodiment, similarly to the substrate treatment system 1 of the first embodiment, it is possible to prevent a decrease in throughput due to the substrate W passing through the single-wafer treatment device 3. In addition, similarly to the substrate treatment system 1 of the third embodiment, it is possible to reduce the burden of carrying the carrier transport mechanism 9 when assembling the substrate treatment system 1.

The present invention is not limited to the above embodiment, and can be modified as follows.

(1) In each of the embodiments described above, the carrier transport mechanism 9 (9A, 9B) includes the placement table 23 (23A, 23B) on which the carrier C is placed. In this regard, the carrier transport mechanism 9 may include, for example, a grip portion (gripper) that grips the protrusion on the upper surface of the carrier C. In this case, the table movement portion 25 moves the grip portion. For example, the carrier transport mechanism 9 may transport the carrier C to and from the grip portion 19 of the first transport robot 17 via a shelf.

Figure 14A:
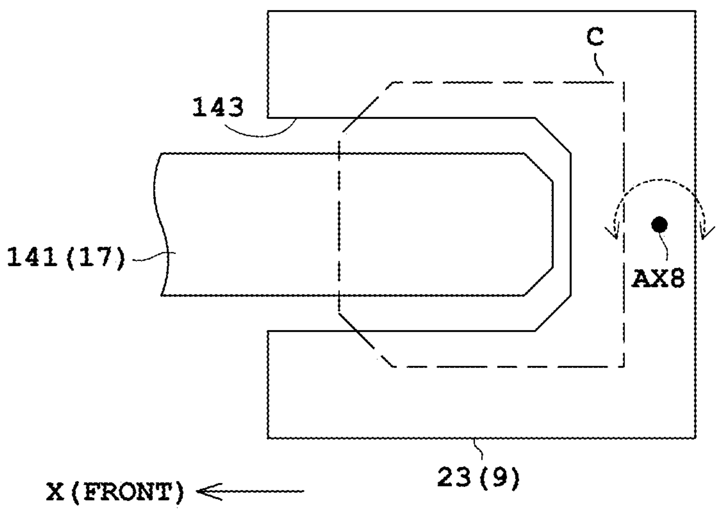
FIG. 14A is a plan view illustrating a support portion of a first transport robot and a placement table of a carrier transport mechanism according to a modification example.
Figure 14B:
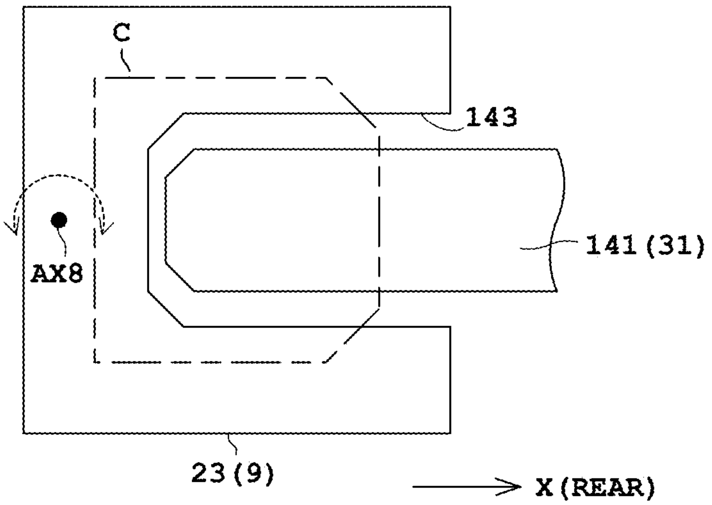
FIG. 14B is a plan view illustrating a support portion of a second transport robot and a placement table of the carrier transport mechanism according to the modification example.

(2) In each of the above-described embodiments and modification example (1), the first transport robot 17 and the second transport robot 31 respectively include the grip portions 19 and 33. In this regard, at least one of the first transport robot 17 and the second transport robot 31 may include a support portion 141 that supports the lower surface of the carrier C (see FIGS. 14A and 14B). When the carrier C is delivered between the support portion 141 and the placement table 23, the placement table 23 may include a notch portion 143 through which a part or the whole of the support portion 141 can pass in the vertical direction Z.

In order to change an orientation of the notch portion 143, the placement table 23 may be rotatable about a vertical axis AX8. For example, when the support portion 141 of the first transport robot 17 transports the carrier C to the placement table 23, the notch portion 143 of the placement table 23 faces the front side (see FIG. 14A). When the support portion 141 of the second transport robot 31 receives the carrier C from the placement table 23, the notch portion 143 faces the rear side (see FIG. 14B).

The carrier transport mechanism 9 may include a grip portion, and at least one of the first transport robot 17 and the second transport robot 31 may include the support portion 141.

(3) In each of the embodiments and the modification examples described above, for example, in the batch treatment tank BT1, the fifty substrates W in which the twenty-five substrates W1 and the twenty-five substrates W2 are alternately disposed one by one are collectively immersed. The fifty substrates W (W1, W2) are aligned at a half pitch (for example, 5 mm). In this regard, in the batch treatment tank BT1, the twenty-five substrates W aligned at a full pitch (for example, 10 mm) may be collectively immersed.

In this case, the selective transport mechanism WTR2 illustrated in FIG. 4 does not need to be provided. The batch transport mechanism WTR1 may be configured to be able to transport a plurality of (for example, twenty-five) substrates W between the four batch treatment tanks BT1 to BT4, the substrate delivery position PP of the first posture turning mechanism 41, the standby tank 69, and the underwater posture turning unit 71. In a case where the selective transport mechanism WTR2 is not provided, the standby tank 69 does not need to be provided.

(4) In each of the embodiments and the modification examples described above, for example, in the batch treatment tank BT1, the fifty substrates W as a treatment substrate group are collectively immersed. In the fifty substrates W (W1, W2), when each of the device surfaces of the twenty-five substrates W1 of the first substrate group faces rightward, each of the device surfaces of the twenty-five substrates W2 of the second substrate group may face leftward. In addition, when each of the device surfaces of the twenty-five substrates W1 of the first substrate group faces rightward, each of the device surfaces of the twenty-five substrates W2 of the second substrate group may face rightward.

(5) In each of the embodiments and the modification examples described above, the stocker device 2 includes the shelf 15B for storing the carrier C. In this regard, in a case where the shelf 15B is unnecessary, the stocker device 2 does not need to include the shelf 15B.

(6) In each of the embodiments and the modification examples described above, disposition of each constituent of the substrate treatment system 1 illustrated in FIG. 1 may be reversed in the width direction Y. For example, in the interface device 5, the carrier movement region R1 may be disposed on the left side of the posture turning region R2.

(7) In each of the embodiments and the modification examples described above, the interface device 5 includes the direction turning belt conveyor 68. Alternatively, the interface device 5 may include the substrate transport robot CR1.

(8) In each of the embodiments and the modification examples described above, the single-wafer transport region R5 illustrated in FIG. 11 or 13 may include the four substrate transport robots CR3 to CR6 and the three substrate placement portions PS1 to PS3 illustrated in FIG. 1. The single-wafer transport region R5 illustrated in FIG. 1 or 13 may include the substrate transport robot CR7 illustrated in FIG. 11. The single-wafer transport region R5 illustrated in FIG. 1 or 11 may include the substrate transport robots CR8 and CR9 and the substrate placement portion PS4 illustrated in FIG. 13. The belt conveyor 101 does not need to be provided. In this case, for example, in FIG. 13, the substrate transport robot CR8 may be configured to be movable in the front-rear direction X similarly to the substrate transport robot CR7 illustrated in FIG. 11. The single-wafer transport region R5 illustrated in FIG. 1, FIG. 11, or FIG. 13 may include at least one substrate transport robot CR7 (CR3).

(9) In each of the embodiments and the modification examples described above, the transfer block 37 includes the substrate handling mechanism HTR and the posture turning unit 51. In this regard, in a case where the substrate handling mechanism HTR is configured by an articulated robot, the posture turning unit 51 may be omitted. In this case, the substrate handling mechanism HTR (articulated robot) may include, for example, five hands 43, and may turn the five substrates W taken out from the carrier C from a horizontal posture to a vertical posture. Then, the substrate handling mechanism HTR (articulated robot) may arrange the five substrates W in the vertical posture on the pusher 53A of the pusher mechanism 53. The pusher 53A (vertical holder) holds the five substrates W directly transported from the substrate handling mechanism HTR in a vertical posture. 30

(10) In each of the embodiments and the modification examples described above, each of the posture turning unit 51 and the underwater posture turning unit 71 may include a substrate accommodation portion that accommodates a plurality of substrates W, and the substrate accommodation portion may be rotatable about a horizontal axis. The horizontal axis is parallel to the rear side or the front-rear direction X and is parallel to each device surface of the plurality of substrates W.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treatment system that performs treatment on a substrate comprising:

a stocker device including a load port for loading and unloading a carrier storing a plurality of substrates, a first carrier placement shelf on which the carrier is placed, and a first transport robot that transports the carrier;

a batch treatment device that collectively performs treatment on the plurality of substrates;

a single-wafer treatment device that performs treatment on the plurality of substrates one by one;

an interface device including a second carrier placement shelf on which the carrier is placed and a second transport robot that transports the carrier; and a carrier transport mechanism that transports the carrier between a stocker device side position on the stocker device side and an interface device side position on the interface device side, wherein the stocker device, the single-wafer treatment device, the interface device, and the batch treatment device are disposed in a line and linearly in this order, the first transport robot transports the carrier, in which a substrate before treatment is stored, placed on the load port to the stocker device side position, the carrier transport mechanism transports the carrier in which the substrate before treatment is stored from the stocker device side position to the interface device side position, the second transport robot transports the carrier in which the substrate before treatment is stored from the interface device side position to the second carrier placement shelf, the batch treatment device takes out the plurality of the substrates from the carrier, in which the substrate before treatment is stored, transported to the second carrier placement shelf, and performs predetermined batch treatment on the plurality of taken-out substrates, the batch treatment device transports the plurality of substrates subjected to the batch treatment to the interface device, the second transport robot transports the carrier that has been emptied by taking out the plurality of substrates from the second carrier placement shelf to the interface device side position, the carrier transport mechanism transports the empty carrier from the interface device side position to the stocker device side position, the first transport robot transports the empty carrier from the stocker device side position to the first carrier placement shelf, the single-wafer treatment device performs predetermined single-wafer treatment on the plurality of substrates received from the interface device one by one, and transports the plurality of substrates subjected to the single-wafer treatment to the empty carrier transported to the first carrier placement shelf, and the first transport robot transports the carrier in which the plurality of substrates subjected to the single-wafer treatment are stored from the first carrier placement shelf to the load port.

2. The substrate treatment system according to claim 1, wherein the batch treatment device includes a transfer block that is adjacent to the second carrier placement shelf, a treatment block that is adjacent to the transfer block in a first direction from the stocker device toward the interface device, and a batch substrate transport region of which one end extends to the inside of the interface device and the other end extends in the first direction, the transfer block includes a substrate handling mechanism that takes out the plurality of substrates from the carrier placed on the second carrier placement shelf and transports the plurality of taken-out substrates, and a vertical holder that is provided between the substrate handling mechanism and the batch substrate transport region, and holds the plurality of substrates received from the substrate handling mechanism in a vertical posture, the treatment block includes a batch treatment tank that stores a treatment liquid for immersing the plurality of substrates, the interface device includes a posture turning mechanism that turns the plurality of substrates subjected to the batch treatment in the batch treatment tank from a vertical posture to a horizontal posture, and the batch treatment transport region includes a batch transport mechanism that transports the plurality of substrates in the vertical posture in parallel to the first direction between the batch treatment tank, the vertical holder, and the posture turning mechanism.

3. The substrate treatment system according to claim 2, wherein the interface device includes a carrier movement region and a posture turning region disposed in a second direction that is a horizontal direction orthogonal to the first direction, the second transport robot is provided in the carrier movement region, the posture turning mechanism is provided in the posture turning region, and the posture turning region includes a housing that blocks an atmosphere from the carrier movement region and accommodates the posture turning mechanism.

4. The substrate treatment system according to claim 1, wherein the batch treatment device includes a first posture turning unit that turns the plurality of substrates from a horizontal posture to a vertical posture, the interface device includes a second posture turning unit that turns the plurality of substrates subjected to the batch treatment from a vertical posture to a horizontal posture, and the batch treatment device takes out the plurality of substrates from the carrier transported to the second carrier placement shelf, turns the plurality of taken-out substrates from a horizontal posture to a vertical posture by using the first posture turning unit, and performs predetermined batch treatment on the plurality of substrates turned into the vertical posture.

5. The substrate treatment system according to claim 1, wherein the single-wafer treatment device includes a carrier transport region including the carrier transport mechanism, a single-wafer transport region including a horizontal substrate transport mechanism that transports at least one substrate in a horizontal posture, and a single-wafer treatment region including a single-wafer treatment chamber that performs predetermined treatment on one substrate, the carrier transport region, the single-wafer transport region, and the single-wafer treatment region are each provided to extend in a first direction from the stocker device toward the interface device, and the carrier transport region, the single-wafer transport region, and the single-wafer treatment region are disposed side by side in this order in a second direction that is a horizontal direction orthogonal to the first direction, and the horizontal substrate transport mechanism transports the at least one substrate between the interface device, the single-wafer treatment chamber, and the carrier transported to the first carrier placement shelf.

6. The substrate treatment system according to claim 1, wherein the carrier transport mechanism is provided above the single-wafer treatment device to overlap the single-wafer treatment device in a plan view.

7. The substrate treatment system according to claim 1, further comprising:

a second carrier transport mechanism that transports the carrier between a second stocker device side position on the stocker device side and a second interface device side position on the interface device side.

8. The substrate treatment system according to claim 1, wherein the first transport robot includes a movable first grip portion that grips the carrier or a movable first support portion that supports a lower surface of the carrier, the second transport robot includes a movable second grip portion that grips the carrier or a movable second support portion that supports a lower surface of the carrier, and the carrier transport mechanism includes a movable third grip portion that grips the carrier or a movable placement table on which the carrier is placed.

* * * * *